United States Patent
Fujita et al.

(10) Patent No.: US 9,625,326 B2
(45) Date of Patent: Apr. 18, 2017

(54) METAL NITRIDE MATERIAL FOR THERMISTOR, METHOD FOR PRODUCING SAME, AND FILM TYPE THERMISTOR SENSOR

(71) Applicant: MITSUBISHI MATERIALS CORPORATION, Tokyo (JP)

(72) Inventors: Toshiaki Fujita, Naka (JP); Hiroshi Tanaka, Naka (JP); Noriaki Nagatomo, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 427 days.

(21) Appl. No.: 14/455,541

(22) Filed: Aug. 8, 2014

(65) Prior Publication Data

US 2015/0049788 A1 Feb. 19, 2015

(30) Foreign Application Priority Data

| Aug. 12, 2013 | (JP) | 2013-167525 |
| Aug. 12, 2013 | (JP) | 2013-167527 |
| Aug. 30, 2013 | (JP) | 2013-180297 |
| Aug. 30, 2013 | (JP) | 2013-180309 |
| Sep. 4, 2013 | (JP) | 2013-182743 |

(51) Int. Cl.

| *H01C 7/10* | (2006.01) |
| *G01K 7/22* | (2006.01) |
| *C30B 25/06* | (2006.01) |
| *C30B 29/38* | (2006.01) |
| *C23C 14/06* | (2006.01) |
| *C30B 29/60* | (2006.01) |
| *H01C 7/00* | (2006.01) |
| *H01C 7/04* | (2006.01) |

(52) U.S. Cl.
CPC ............ *G01K 7/22* (2013.01); *C23C 14/0676* (2013.01); *C30B 25/06* (2013.01); *C30B 29/38* (2013.01); *C30B 29/605* (2013.01); *H01C 7/008* (2013.01); *H01C 7/04* (2013.01)

(58) Field of Classification Search
CPC .......... H01C 1/012; H01C 7/006; H01C 1/14; H01C 7/008; G01K 7/226
USPC ................................................ 338/22 R, 13
See application file for complete search history.

(56) References Cited

U.S. PATENT DOCUMENTS

| 6,989,574 B2* | 1/2006 | Parsons | H01C 7/022 257/417 |
| 2004/0224459 A1* | 11/2004 | Nishikawa | C30B 23/02 438/202 |
| 2010/0104495 A1* | 4/2010 | Kawabata | C30B 7/10 423/409 |
| 2014/0193623 A1* | 7/2014 | Setoyama | B23B 27/14 428/216 |

* cited by examiner

*Primary Examiner* — Kyung Lee
(74) *Attorney, Agent, or Firm* — Locke Lord LLP

(57) ABSTRACT

The metal nitride material for a thermistor consists of a metal nitride represented by the general formula: $(M_{1-v}A_v)_x Al_y(N_{1-w}O_w)_z$ (where "M" represents at least one of Ti, V, Cr, Mn, Fe, and Co, "A" represents at least one of Sc, Zr, Mo, Nb, and W, $0.0<v<1.0$, $0.70 \le y/(x+y) \le 0.98$, $0.45 \le z \le 0.55$, $0<w \le 0.35$, and $x+y+z=1$), wherein the crystal structure thereof is a hexagonal wurtzite-type single phase.

10 Claims, 18 Drawing Sheets

METAL NITRIDE MATERIAL FOR THERMISTOR, METHOD FOR PRODUCING SAME, AND FILM TYPE THERMISTOR SENSOR

CROSS-REFERENCE TO RELATED APPLICATIONS

This application is a U.S. Utility Application under 35 U.S.C. 111 which claims the priority benefit of Japanese Application No. 2013-167525, filed Aug. 12, 2013; Japanese Application No. 2013-167527, filed Aug. 12, 2013; Japanese Application No. 2013-180297, filed Aug. 30, 2013; Japanese Application No. 2013-180309, filed Aug. 30, 2013; and Japanese Application No. 2013-182743, filed Sep. 4, 2013, the entire contents of the aforementioned applications are hereby incorporated herein by reference.

BACKGROUND OF THE INVENTION

Field of the Invention

The present invention relates to a metal nitride material for a thermistor, which can be directly deposited on a film or the like without firing, a method for producing the same, and a film type thermistor sensor.

Description, of the Related Art

There is a demand for a thermistor material used for a temperature sensor or the like having a high B constant in order to obtain a nigh precision and high sensitivity thermistor sensor. Conventionally, transition metal oxides such as Mn, Co, Fe, and the like are typically used as such thermistor materials (see Patent Documents 1 to 3). These thermistor materials need a heat treatment such as firing or the like at a temperature of 550° C. or higher in order to obtain a stable thermistor characteristic/property.

In addition to thermistor materials consisting of metal oxides as described above. Patent Document 4 discloses a thermistor material consisting of a nitride represented by the general formula: $M_xA_yN_z$ (where "M" represents at least one of Ta, Nb, Cr, Ti, and Zr, "A" represents at least one of Al, Si, and B, $0.1 \leq x \leq 0.8$, $0 \leq y \leq 0.6$, $0.1 \leq z \leq 0.08$, and $z+y+z=1$). In Patent Document 4, only a Ta—Al—N-based material consisting of a nitride represented by the general formula: $M_xA_yN_z$ (where $0.5<x\leq0.8$, $0.1\leq y\leq0.5$, $0.2\leq z\leq0.7$, and $x+y+z=1$) is described in an Example. The Ta—Al—N-based material is produced by sputtering in a nitrogen gas-containing atmosphere using a material containing the element (s) listed above as a target. The resultant thin film is subject to a heat treatment at a temperature from 350 to 600° C. as required.

Other than thermistor materials, Patent, document 5 discloses a resistance film macenal for a strain sensor, which consists of a nitride represented by the general formula; $Cr_{100-x-y}N_xM_y$ (where "M" is one or more elements selected from Ti, V, bb, Ta, Ni, Zr, Hf, Si, Ge, C, O, P, Se, Te, Zn, Cu, Bi, Fe, Mo, W, As, Sn, Sb, Pb, B, Ga, In, Tl, Ru, Rh, Re, Os, Ir, Pt, Pd, Ag, Au, Co, Be, Mg, Ca, Sr, Ba, Mn, Al, and rare earth elements, the crystal structure thereof is composed of mainly a bcc structure or mainly a mixed structure of a bcc structure and A15 type structure, $0.0001\leq X\leq30$, $0\leq y\leq30$, and $0.0001\leq x+y\leq50$). The resistance film material for a strain, sensor is employed for measuring strain and stress from changes in the resistance of the sensor made of a Cr—N-based strained resistance film, where both of the amounts of nitrogen (x) and an accessory component element(s) b (y) are 30 at % or lower, as well as for performing carious conversions. The Cr—N—M-based material is produced by reactive sputtering in a deposition atmosphere containing the accessory gaseous element(s) using a material containing the above-described element (s) or the like as a target. The resultant thin film is subject to a heat treatment at a temperature from 200 to 1000° C. as required.

PRIOR ART DOCUMENTS

Patent Documents

[Patent Document 1] Japanese Patent Laid-open No. 2000-068110
[Patent Document 2] Japanese Patent Laid-Open No. 2000-348903
[Patent Document 3] Japanese Patent Laid-Open No. 2006-324520
[Patent Document 4] Japanese Patent Laid-open No. 2004-319737
[Patent Document 5] Japanese Patent laid-Open No. H10-270201

SUMMARY OF THE INVENTION

[Problems to be Solved by the Invention]

The following problems still remain in the conventional techniques described above.

In recent years, the development of a film type thermistor sensor made of a thermistor material formed on a resin film has been considered; and thus, it has been desired to develop a thermistor material that can be directly deposited on a film. Specifically, it is expected that a flexible thermistor sensor will be obtained by using a film. Furthermore, it is desired to develop a very thin, thermistor sensor having a thickness of about 0.1 mm. However, a substrate material using a ceramic such as alumina that has often been conventionally used has a problem that if the substrate material is thinned to a thickness of 0.1 mm for example, the substrate material is very fragile and breaks easily. Thus, it is expected that a very thin thermistor sensor will be obtained by using a film.

However, a film made of a resin material typically has a low heat resistance temperature of 150° C. or lower, and even polyimide, which is known as a material having a relatively high heat resistance temperature, only has a heat resistance temperature of about 200° C. Hence, when a neat treatment is performed in a process of forming a thermistor material, it has been conventionally difficult to use such a thermistor material. The above-described conventional oxide the thermistor material needs to be fired at a temperature of 550° C. or higher in order to realize a desired thermistor characteristic, so that a film type thermistor sensor that is directly deposited on a film cannot be realized. Thus, it has been desired to develop a thermistor material that can be directly deposited on a film without firing. However, even the thermistor material disclosed in Patent Document 4 still needs a heat treatment on the resultant thin film at a temperature from 350 to 600° C. as required in order to obtain a desired thermistor characteristic. Regarding this thermistor material, a B constant of about 500 to 3000 K was obtained in an Example of the Ta—Al—N-based material, but the heat resistance of this material is nor described and therefore, the thermal reliability of a nitride-based material is unknown.

In addition, the Cr—N—M-based material disclosed in Parent document 5 has a low B constant, of 500 or lower and cannot ensure heat resistance to a temperature of 200° C. or lower unless a heat treatment in the range of 200° C. to 1000° C. is performed, and thus, a film type thermistor sensor that, is directly deposited on a film cannot be realized. Therefore, it has been desired to develop a thermistor material that can be directly deposited on a film without firing.

The present invention has been made in view of the aforementioned circumstances, and an object of the present invention is to provide a metal nitride material for a thermistor, which has high reliability and high heat resistance and can be directly deposited on a film or the like without firing, a method for producing the same, and a film type thermistor sensor.

[Means for Solving the Problems]

The present inventors' serious endeavor carried out by focusing on an Al—N-based material among nitride materials found that the Al—N-based material having a good B constant, and excellent heat resistance may be obtained without firing by substituting the Al site with a specific metal, element for improving electric conductivity and by ordering it into a specific crystal structure even though Al—N is an insulator and difficult to provide with an optimum thermistor characteristic (B constant: about 1000 to 6000 K).

Therefore, the present invention has been made on the basis of the above finding, and adopts the following configuration in order to overcome the aforementioned problems.

Specifically, a metal nitride material for a thermistor according to a first aspect of the present invention is characterized by a metal nitride material for a thermistor, which consists of a metal nitride represented by the general formula: $(M_{1-v}A_v)_xAl_y(N_{1-w}O_w)_z$ (where "M" represents at least one of Ti, V, Cr, Mn, Fe, and Co, "A" represents at least one of Sc, Zr, Mo, Nb, and W, $0.0<v<1.0$, $0.70\leq y/(x+y)\leq 0.98$, $0.45\leq z\leq 0.55$, $0<w\leq 0.35$, and $x+y+=1$), wherein the crystal structure thereof is a hexagonal wurtzite-type single phase.

Since the metal nitride material for a thermistor consists of a metal nitride represented by the general formula: $(M_{1-v}A_v)_xAl_y(N_{1-w}O_w)_z$ (where "M" represents at least one of Ti, V, Cr, Mn, Fe, and Co, "A" represents at least one of Sc, Zr, Mo, Nb, and W, $0.0<v<1.0$, $0.70\leq y/(x+y)\leq 0.98$, $0.45\leq z\leq 0.55$, $0<w\leq 0.35$, and $x+y+=1$), wherein the crystal structure thereof is a hexagonal wurtzite-type single phase, a good B constant and excellent heat resistance can be obtained without firing. In particular, the heat resistance can be further improved by the effect of oxygen (O) included in a crystal so as to compensate nitrogen defects in the crystal or to introduce interstitial oxygen therein, or the like.

Note that, when the value of "y/(x+y)" (i.e., Al/(M+A+Al)) is less than 0.70, a wurtzite-type single phase cannot be obtained, but two coexisting phases of a wurtzite-type phase and a NaCl-type phase or a single phase of only a NaCl-type phase may be obtained, so that a sufficiently high resistance and a high B constant cannot be obtained.

When the value of "y/(x+y)" (i.e., Al/(M+A+Al)) exceeds 0.98, the metal nitride material exhibits very high resistivity and extremely high electrical insolation, so that the metal nitride material is not applicable as a thermistor material.

When the value of "z" (i.e., (N+O)/(M+A+Al+N+O)) is less than 0.45, the amount of nitridation is too small to obtain a wurtzite-type single phase. Consequently, a sufficiently high resistance and a high B constant cannot be obtained.

In addition, when the value of "z" (i.e., (N+O)/(M+A+Al+N+O)) exceeds 0.50, a wurtzite-type single phase cannot be obtained. This is because the stoichiometric ratio of (N+O)/(M+A+Al+N) in a wurtzite-type single phase in the absence of defects at the nitrogen site is 0.5 (.i.e., N(M+A+Al+N=0.5, and because the stoichiometric ratio of (N+O)/(M+A+Al+N+O) when all defects at the nitrogen site are compensated by oxygen is 0.5 (i.e., (N+O)/(M+A+Al+N+O)=0.5). The amount of "z" exceeding 0.5 may be due to the interstitial oxygen introduced in a crystal or due to the quantitative accuracy of the light elements (nitrogen, oxygen) in an XPS analysis.

In addition, in this study, when the value of "w" (i.e., O/(N+O)) exceeded 0.35, a wurtzite-type single phase could not be obtained. The reason will be understandable considering the fact that when $w=1$, $y/(x+y)=0$, and $v=1$, a corundum-type $Sc_2O_3$ phase is formed in the case of "A"=Sc, a fluorite-type $ZrO_z$ phase is formed in the case of "A"=Zr, a rutile-type $MoO_2$ phase or a $MoO_3$ phase having the same crystal structure as rhenium trioxide ($ReO_3$) is formed in the case of "A"=Mo, a rutile-type $NbO_2$ phase is formed in the case of "A"=Nb, and a distorted rutile-type $WO_2$ phase is formed in the case of "A"=W; when $w=1$, $y/(x+y)=0$, and $v=0$, a rutile-type $(M1)O_2$ phase, a corundum-type $(M2)_2O_3$ phase, a spinel-type $(M3)_3O_4$ phase (where "M1" represents Ti, "M2" represents V, Cr , or Fe, and "M3" represents Mn or Co) is formed; and when $w=1$ and $y/(x+y)=1$, a corundum-type $Al_2O_3$ phase is formed. It has been found that when the value of "w" increases and the amount of oxygen increases with respect to the amount of nitrogen, it is difficult to obtain a wurtzite-type single phase. Therefore, it has been found in this study that a wurtzite-type single phase can be obtained only when O/(N+O) is 0.35 or less.

A metal nitride material for a thermistor according to a second aspect of the present invention is characterized in that the metal nitride material for a thermistor according to the first aspect of the present invention is deposited as a film, and is a columnar crystal extending in a vertical direction with respect to the surface of the film.

Specifically, since she metal nitride material for a thermistor is a columnar crystal extending in a vertical direction with respect to the surface of the film, the crystallinity of the film is high, so that high heat resistance can be obtained.

A metal nitride material for a thermistor according to a third aspect of the present invention is characterised in that the metal nitride material according to the first or the second aspect of the present invention is deposited as a film, and is more strongly oriented along a c-axis than an a-axis in a vertical direction with respect to the surface of the film.

Specifically, since the metal nitride material for a thermistor is more strongly oriented along the c-axis than the a-axis m a vertical direction with respect to the surface of the film, a high B constant as compared with the case of the strong a-axis orientation, and an excellent reliability in heat resistance can be obtained.

A film type thermistor sensor according to a fourth aspect of the present invention is characterised by including an insulating film; a thin film, thermistor portion made of the metal nitride material for a thermistor according to any one of the first to third aspects of the present invention on the insulating film; and a pair of pattern electrodes formed at least on the top or the bottom of the thin film thermistor portion.

Specifically, since, in the film type thermistor sensor, the thin film thermistor portion made of the metal nitride material for a thermistor according to any one of the first to third aspects of the present invention is formed on the insulating film, an insulating film having low heat resistance such as a resin film can be used because the thin film thermistor portion is formed without firing and has a high B constant arid high heat resistance, so that a thin and flexible thermistor sensor having an excellent thermistor characteristic can be obtained.

A substrate material employing a ceramic such as alumina that has often been conventionally used has a problem that if the substrate material is thinned to a thickness of 0.1 mm for example, the substrate material is very fragile and breaks easily. On the other hand, since a film can be used in the present invention, a very thin film type thermistor sensor having a thickness of 0.1 mm can be obtained.

A method for producing a metal nitride material for a thermistor according to a fifth aspect of the present invention is characterised, in that the method for producing the metal nitride material for a thermistor according to any one of the first to third aspects of the present invention includes a deposition step of performing film deposition by sputtering (reactive spattering) in a nitrogen- and oxygen-containing atmosphere using an M-A-Al alloy sputtering target (where represents at least one of Ti, v, Cr, Ma, Fe, and Co, and "A" represents at least one of Sc, Zr, Mo, Nb, and W).

Specifically, since, in the method for producing the metal nitride material for a thermistor, the film deposition is performed by reactive sputtering in a nitrogen- and oxygen-containing atmosphere using an M-A-Al alloy sputtering target, the metal nitride material for a thermistor or the present invention, which consists of a metal nitride represented by the aforementioned general formula: $(M, A)_x Al_y (N,O)_z$ ("M" represents at least one of Tif V, Cr, Mn, Fe, and Co, and "A" represents at least one of Sc, Zr, Mo, Nb, and W) can be deposited on a film without firing.

[Effects Of The Invention]

According to the present invention, the following effects may be provided.

Specifically, since the metal nitride material for a thermistor according to the present invention, consists of a metal nitride represented by the general formula: $(M_{1-v}A_v)_x Al_y (N_{1-w}O_w)_z$ (where "M" represents at least one of Ti, V, Cr, Mn, Fe, and Co, "A" represents at least one of Sc, Zr, Mo, Nb, and W, $0.0<v<1.0$, $0.70 \leq y/(x+y) \leq 0.98$, $0.45 \leq z \leq 0.55$, $0<w \leq 0.35$, and $x+y+z=1$), wherein the crystal structure thereof is a hexagonal wurtzite-type single phase, the metal nitride material having a good B constant and excellent heat resistance can be obtained without firing. Also, since, in the method for producing the metal nitride material, for a thermistor according to the present invention, film deposition is performed by reactive sputtering in a nitrogen- and oxygen-containing atmosphere using an M-A-Al alloy sputtering target (where "M" represents at least one of Ti, V, Cr, Mn, Fe and Co, and "A" represents at least one of Sc, Zr, Mo, Nb, and W), the metal nitride material for a thermistor of the present invention, which consists of a metal nitride represented by the aforementioned general formula; $(M, A)_z Al_y (N,O)_z$, can be deposited on a film without firing. Furthermore, since, in the film, type thermistor sensor according to the present invention, a thin film thermistor portion made of the metal nitride material for a thermistor according to the present invention is formed on an insulating film, a thin and flexible thermistor sensor having an excellent thermistor characteristic can be obtained by using an insulating film such as a resin film having low heat resistance. Furthermore, since a substrate material is a resin film rather than a ceramic that becomes very fragile and breaks easily when being thinned, a very thin film type thermistor sensor having a thickness of 0.1 mm can be obtained.

DESCRIPTION OF THE EMBODIMENTS

Figure 1:
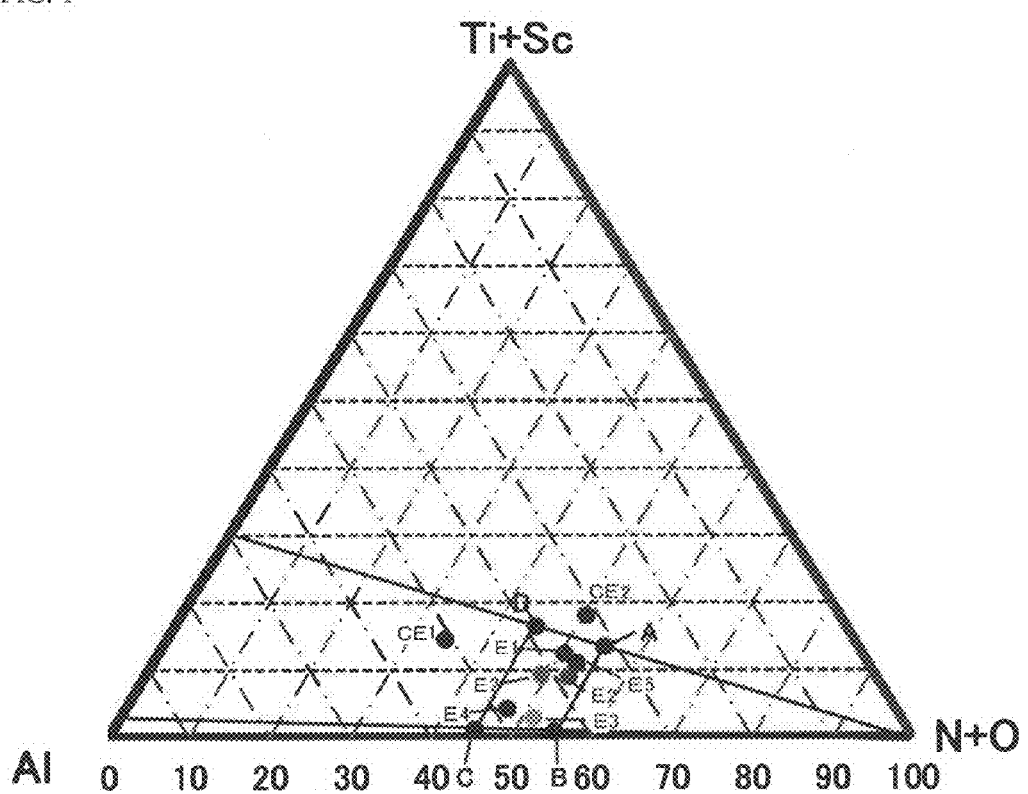
FIG. 1 is a (Ti+Sc)—Al—(N+O)-based ternary phase diagram illustrating the composition range of a metal nitride material for a thermistor according to one embodiment of a metal nitride material for a thermistor, a method for producing the same, and a film type thermistor sensor of the present invention.

Hereinafter, a description will be given of a metal nitride material for a thermistor, a method for producing the same, and a film type thermistor sensor according to one embodiment of the present invention with reference to FIGS. 1 to 7. In the drawings used in the following description, the scale of each component is changed as appropriate so that each component is recognizable or is readily recognized.

The metal nitride material for a thermistor of the present embodiment consists of a metal nitride represented by the general formula: $(M_{1-v}A_v)_xAl_y(N_{1-w}O_w)_z$ (where "M" represents at least one of Ti, V, Cr, Mn, Fe, and Co, "A" represents at least one of Sc, Zr, Mo, Nb, and W, $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type (space group: $P6_3mc$ (No. 186)) single phase.

For example, in the case where "M"=Ti, "A"=Sc, the metal nitride material for a thermistor of the present embodiment consists of a metal nitride represented by the general formula: $(Ti_{1-v}Sc_v)_xAl_y(N_{1-w}O_w)_z$ (where $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type single phase. Specifically, the metal nitride material for a thermistor consists of a metal nitride having a composition within the region enclosed by the points A, B, C, and D in the (Ti+Sc (scandium))-Al-(N+O)-based ternary phase as shown in FIG. 1, wherein the crystal phase thereof is wurtzite-type.

Figure 2:
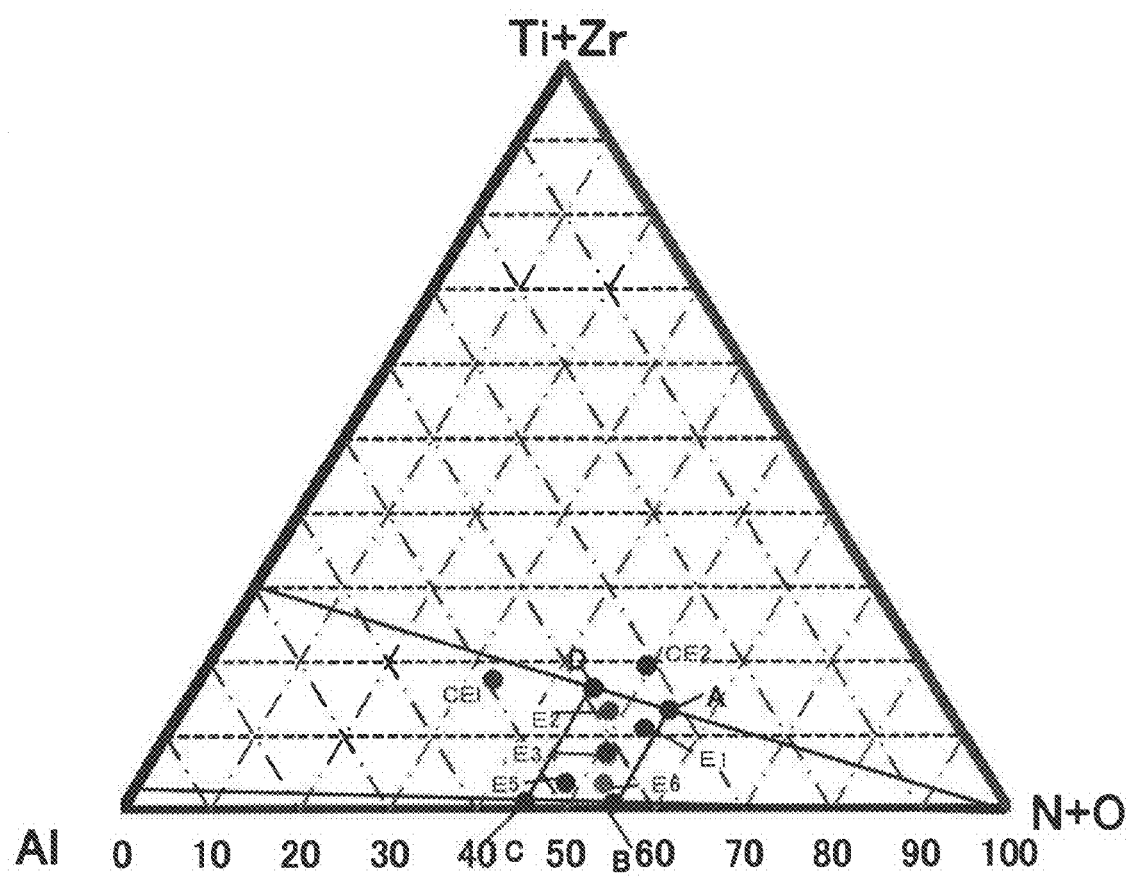
FIG. 2 is a (Ti+Zr)—Al—N+O)-based ternary phase diagram illustrating the composition range of a metal nitride material for a thermistor according to one embodiment of a metal nitride material for a thermistor, a method for producing the same, and a film type thermistor sensor of the present invention.

In the case where "M"=Ti, "A"=Zr, the metal nitride material for a thermistor of the present, embodiment consists of a metal nitride represented try the general formula: $(Ti_{1-v}Zr_v)_xAl_y(N_{1-w}O_w)_z$ (where $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type single phase. Specifically, the metal nitride material for a thermistor consists of a metal nitride having a composition within the region enclosed by the points A, B, C, and D in the (Ti+Zr (zirconium)-Al—(N+O)-based ternary phase diagram as shown in FIG. 2, wherein the crystal phase thereof is wurtzite-type.

Figure 3:
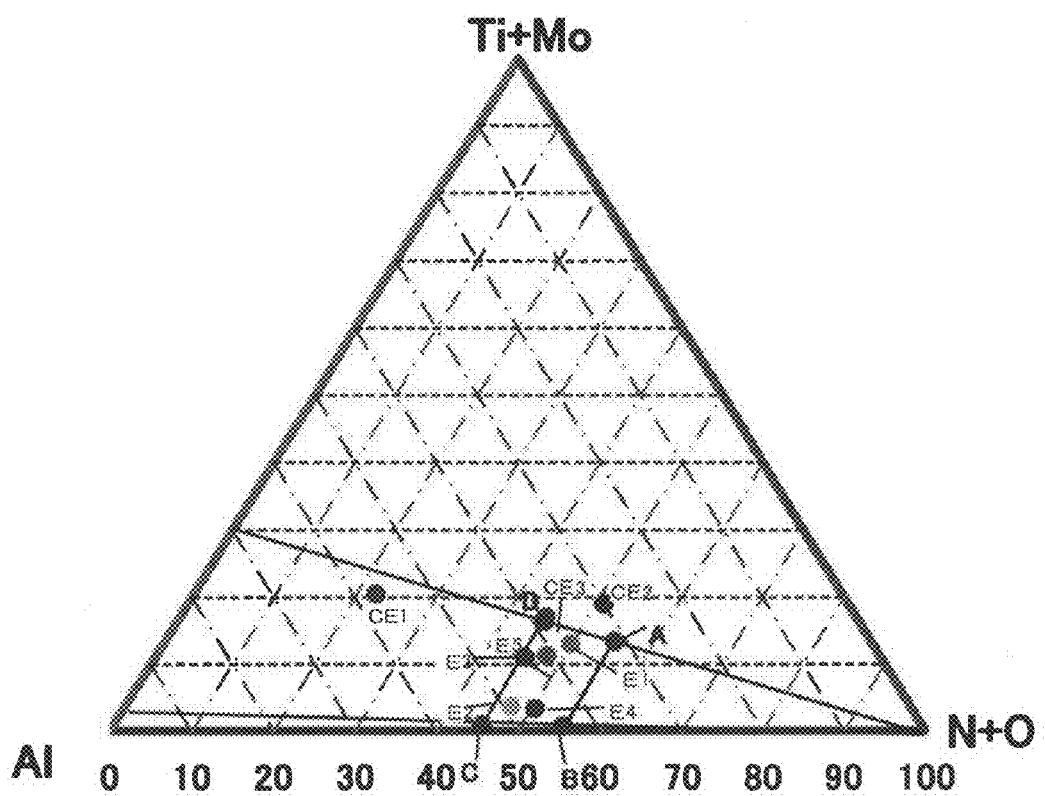
FIG. 3 is a (Ti+Mo)—Al—(N+O)-based ternary phase diagram illustrating the composition range of a metal nitride material for a thermistor according to one embodiment of a metal nitride material for a thermistor, a method for producing the same, and a film type thermistor sensor of the present invention.

In the case where "M"=Ti, "A"=Mo, the metal nitride material for a thermistor of the present embodiment consists of a metal nitride represented by the general formula: $(Ti_{1-v}Mo_v)_xAl_y(N_{1-w}O_w)_z$ (where $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type single phase. Specifically, the metal nitride material for a thermistor consists of a metal nitride having a composition within the region enclosed by the points A, B, C, and D in the (Ti+Mo (molybdenum))-Al—(N+O)-based ternary phase diagram as shown in FIG. 3, wherein the crystal phase thereof is wurtzite-type.

Figure 4:
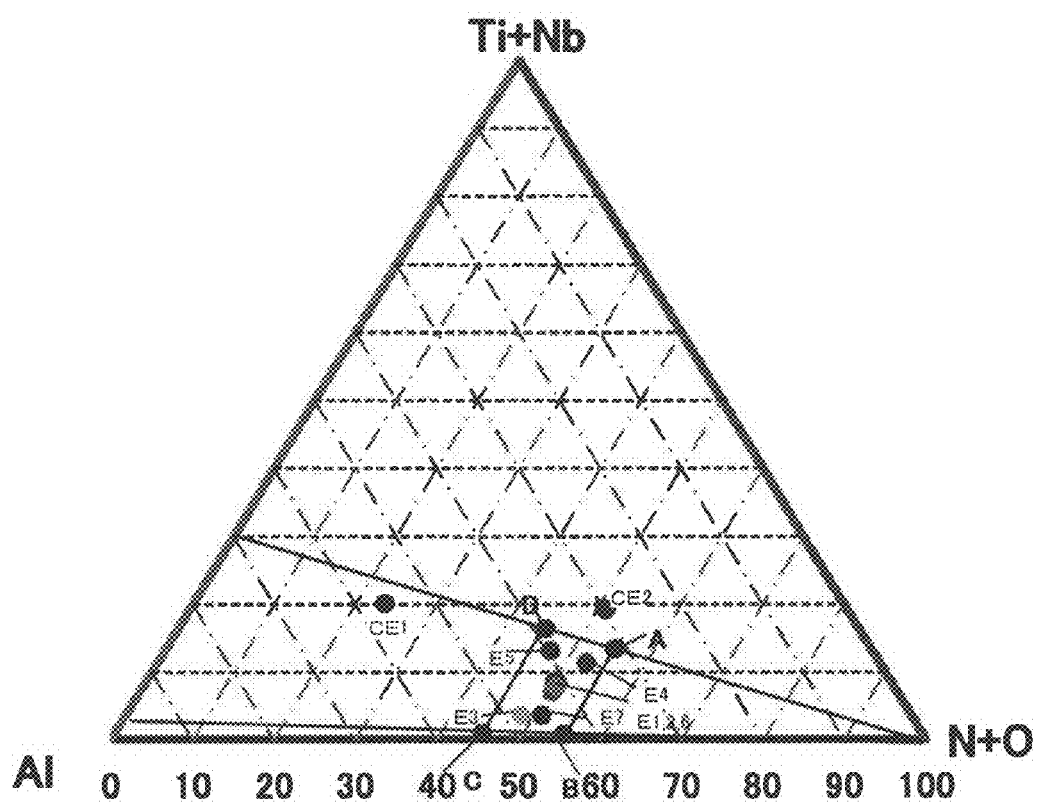
FIG. 4 is a (Ti+Nb)—Al—(N+O)-based ternary phase diagram illustrating the composition range of a metal nitride material for a thermistor according to one embodiment of a metal nitride material for a thermistor, a method for producing the same, and a film type thermistor sensor of the present invention.

In the case where "M"=Ti, "A"=Nb, the metal nitride material for a thermistor of the present embodiment consists of a metal nitride represented by the general formula: $(Ti_{1-v}Nb_v)_xAl_y(N_{1-w}O_w)_z$ (where $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type single phase. Specifically, the metal nitride material for a thermistor consists of a metal nitride having a composition within the region enclosed by the points A, B, C, and D in the Ti+Nb (niobium))-Al—(N+O)-based ternary phase diagram as shown in FIG. 4, wherein the crystal phase thereof is wurtzite-type.

Figure 5:
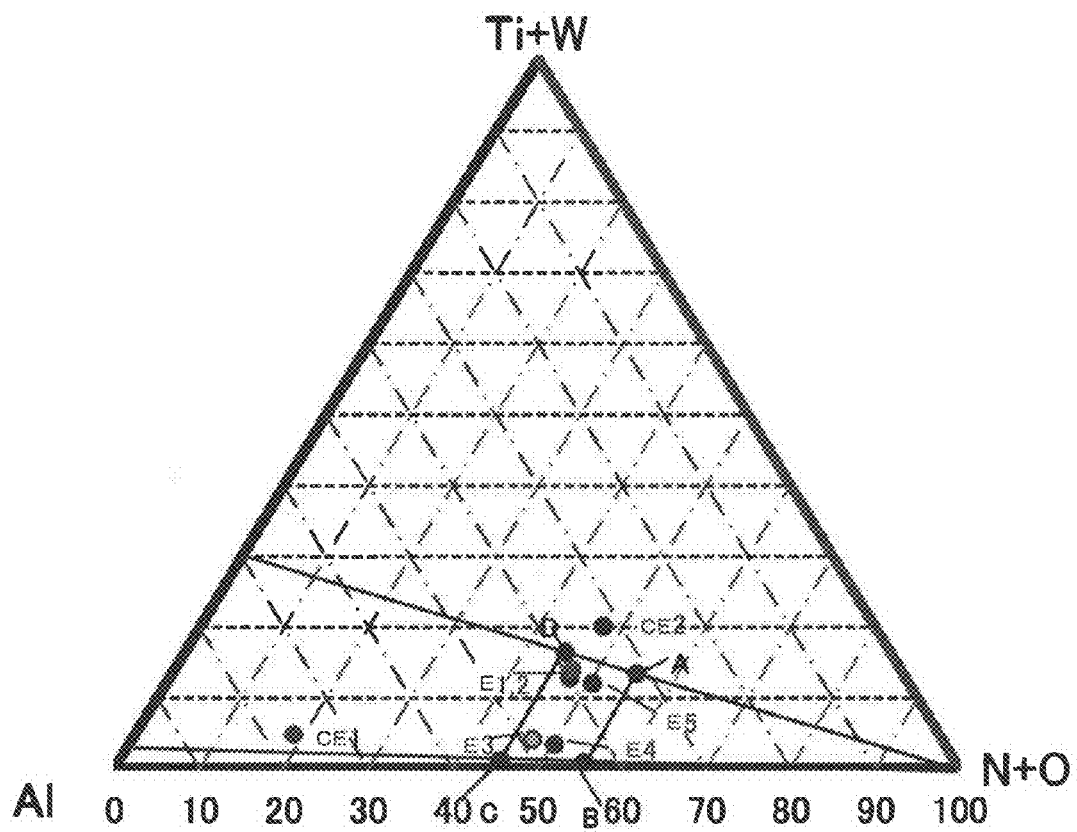
FIG. 5 is a (Ti+W)—Al—(N+O)-based ternary phase diagram illustrating the composition range of a metal nitride material for a thermistor according to one embodiment of a metal nitride material for a thermistor, a method for producing the same, and a film type thermistor sensor of the present invention.

In the case where "M"=Ti, "A"=W, the metal nitride material for a thermistor of the present embodiment consists of a metal nitride represented by the general formula: $(Ti_{1-v}W_v)_xAl_y(N_{1-w}O_w)_z$ (where $0.0 < v < 1.0$, $0.70 \le y/(x+y) \le 0.98$, $0.45 \le z \le 0.55$, $0 < w \le 0.35$, and $x+y+z=1$), wherein the crystal structure thereof is a hexagonal wurtzite-type single phase. Specifically, the metal nitride material for a thermistor consists of a metal nitride having a composition within the region enclosed by the points A, B, C, and D in the (Ti+W (tungsten))-Al—(N+O)-based ternary phase diagram as shown in FIG. 5, wherein the crystal phase thereof wurtzite-type.

Note that the composition ratios or (x, y, z) (at %) at the points A, B, C, and D are A (x, y, z=13.5, 31.5, 55.0), 8 (x, y, z=0.9, 44.1, 55.0), C (x, y, z=1.1, 53.9, 45.0), and D (x, y, z=16.3, 38.5, 45.0), respectively.

As described above, the wurtzite-type crystal structure belongs to the hexagonal space group of $P6_3mc$ (No. 186), and Ti, A, and Al (where "A" represents at least one of Sc, Zr, Mo, Nb and W) are present at the same atomic site, that is, they are in a so-called solid solution for example, in the case of "$Ti_{0.08}Mo_{0.02}Al_{0.9}N$", Ti, Mo, and Al are present at the same atomic site with the probability of 8%, 2%, and 90%, respectively). The wurtzite-type crystal structure is a structure in which the vertexes of (Ti, A, Al) $N_4$ tetrahedron are connected each other and the nearest-neighbor site of the (Ti, A, Al) site is N (nitrogen), whereby (Ti, A, Al) is four-coordinated by nitrogen.

Note that, other than Ti, V (vanadium), Cr (chromium), Mn (manganese), Fe (iron), and Co (cobalt can also be present at the same atomic site as Ti in the above crystal structure, and can be an element of M. The effective ionic radius is a physical property that is often used in order to determine the interatomic distance. In particular, using well known literature values for the ionic radius by Shannon, it is logically assumed that a wurtzite-type (V, A)Al—N—O, (Cr, A)Al—N—O, (Mn, A)Al—N—O, (Fe, A) Al—N—O, and (Co, A)Al—N—O (where "A" represents at least: one of Sc, Zr, Mo, Nb, and W) structure can be obtained. Here, the oxygen (O) is oxygen that compensates nitrogen defects in a crystal or is interstitial oxygen.

Table 1 shows the effective ionic radius of each ion species of Al, Ti, V, Cr, Mn, Fe, and Co (ref., R, D. Shannon, Acta Crysta.) logr. , Sect, A, 32, 751 (1976)).

TABLE 1

UNIT: nm

| FOUR-COORDINATED STRCUTURE | | SIX-COORDINATED STRCUTURE (REFERENCE) | |
|---|---|---|---|
| ION SPECIES | IONIC RADIUS | ION SPECIES | IONIC RADIUS |
| $Al^{3+}$ | 0.039 | $Al^{3+}$ | 0.0535 |
| $Ti^{4+}$ | 0.042 | $Ti^{3+}$ | 0.067 |
| $V^{5+}$ | 0.0355 | $V^{3+}$ | 0.064 |
| $Cr^{4+}$ | 0.041 | $Cr^{3+}$ | 0.0615 |
| $Cr^{5+}$ | 0.0345 | | |
| $Mn^{2+}$ | 0.066 | $Mn^{3+}$ (HS) | 0.0645 |
| $Mn^{4+}$ | 0.039 | | |
| $Mn^{5+}$ | 0.033 | $Mn^{3+}$ (LS) | 0.058 |
| $Fe^{2+}$ | 0.063 | $Fe^{3+}$ (HS) | 0.0645 |
| $Fe^{3+}$ | 0.049 | $Fe^{3+}$ (LS) | 0.055 |
| $Co^{2+}$ | 0.058 | $Co^{3+}$ (HS) | 0.061 |
| $Co^{4+}$ | 0.04 | $Co^{3+}$ (LS) | 0.0545 |

The wurtzite-type crystal structure exhibits a four-coordinated structure. Referring to the effective ionic radius relative to M regarding the four-coordinated structure, the order of the effective ionic radius is Co<Fe<Mn in the case of divalent ions, Al<Fe in the case of trivalent ions, Mn<Cr<Ti in the case of tetravalent ions, and Cr<V in the case of pentavalent ions. From these results, it is contemplated that (Al, Co)<Fe<Mn<Cr<(V, Ti) (the size relationships of the ionic radius between Ti and V or Co and Al cannot be determined). However, since the valences in the data regarding the four-coordinated structure are different from each other, their precise comparison is impossible. Then, referring to the data regarding the six-coordinated structure (i.e., $MN_6$ octahedron) in which the valences are fixed so as to be trivalent, it is found that the order of the ionic radius is Al<Co<Fe<Mo<Cr<V<Ti (in Table 1, "HS" denotes a high-spin state and "LS" denotes a low-spin state).

The present invention provides an excellent thermistor characteristic by substituting the Al site of Al—N, which is an insulator, with Ti or the lake to perform carrier doping, thereby increasing electric conductivity. For example, when the Al site is substituted with Ti, the mean ionic radius between Al and Ti increases because the effective ionic radius of Ti is larger than that of Al. As the result, it is assumed that the atomic distance increases, resulting in the increase of the lattice constant.

The increase of the lattice constant by substituting the Al site of Al—N with Ti or the like has been confirmed by X-ray data. Per example, in the X-ray diffraction data described below in the case where "M"=Ti (FIGS. 13 to 23), the peak of (Ti, A)Al—N—O is shifted more to the lower angle side than the peak of Al—N. From the result, it is found chat the lattice constant of (Ti, A)Al—N—O is larger than that of Al—N. Note that since the oxygen (O) is oxygen that compensates nitrogen defects in a crystal or is interstitial oxygen, there is few changes in the lattice constant. Hence, it is assumed that the change in the lattice constant is not due to the oxygen. In addition to the result described above, the fact that the X-ray diffraction peak corresponding to Al—N is not split shows that Ti and A are in a solid solution at the Al site. The main reason why the lattice constant increases in this test is because the increase of a (M+A)/(M+A+Al) ratio causes the increase of the mean ionic radius because the ionic radius of M, such as Ti, and A is larger than that of Al. Note that the substitution amount of M and A in the Al site in order to maintain the wurzite-type structure has a solubility limit. When (M+A)/(M+A+Al) is larger than 0.3 (i.e., Al/(M+A+Al) becomes less than 0.7), a NaCl-type phase tends to be more easily generated than a wurtzite-type phase.

In addition, since the ionic radius of V, Cr, Mn, Fe, and Co falls within a value between Al and Ti, in view of the lattice constant of the wurzite-type crystal structure, it is contemplated that the substitution of the Al site with V, Cr, Mn, Fe, or Co not with Ti can suppress the increase of the lattice constant, when compared by the same substitution amount, which may allow the wurtzite-type crystal structure to be easily managed. Since V, Cr, Mn, Fe, and Co also have a 3d electron(s) and a 4s electron (s) like Ti, carrier doping at the Al site is possible.

Also, the metal nitride material for a thermistor of the present embodiment is deposited as a film, and is a columnar crystal extending in a vertical direction with respect to the surface of the film. Furthermore, it is preferable that the metal, nitride material for a thermistor is more strongly oriented along the c-axis than the a-axis in a vertical direction with respect to the surface of the film.

Note that the decision about whether a moral nitride material for a thermistor has a strong a-axis orientation (100) or a strong c-axis orientation (002) in a vertical direction with respect to the surface or the film is determined by examining the orientation of the crystal axis using X-ray diffraction (XPD). When the peak intensity ratio of "the peak intensity of (100)"/"the peak intensity of (002)", where (100) is the hkl index indicating a-axis orientation and (002) is the hkl index indicating c-axis orientation, is less than 1, the metal nitride material for a thermistor is determined to nave a strong c-axis orientation.

Figure 6:
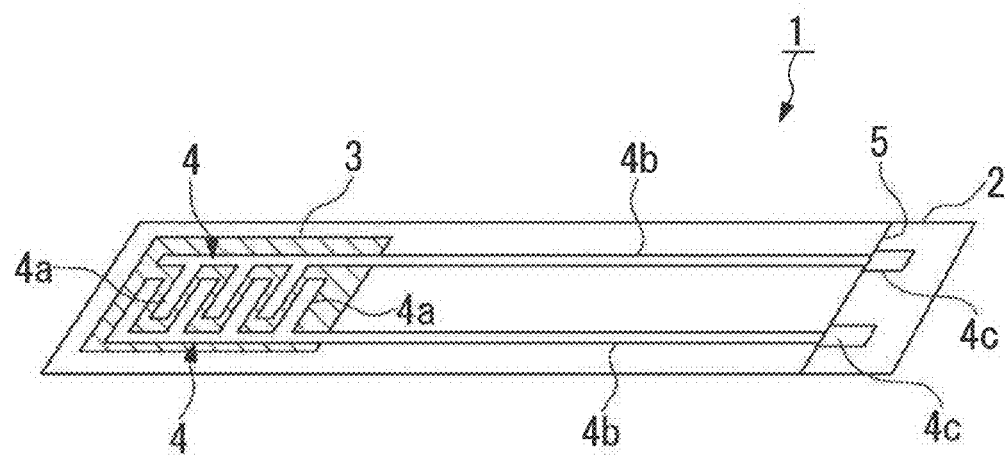
FIG. 6 is a perspective view illustrating a film type thermistor sensor according to the present embodiment.

Next, a description will be given of a film type thermistor sensor using the metal nitride material for a thermistor of the present embodiment. As shown in FIG. 6, a film type thermistor sensor 1 includes an insulating film 2, a thin film thermistor portion 3 made of the metal nitride material for a thermistor on the insulating film 2, and a pair of pattern electrodes 4 formed at least on the thin film thermistor portion 3.

The insulating film 2 is, for example, a polyimide resin sheet formed in a band shape. The insulating film 2 may foe made of another material such as polyethylene terephthalate (PET), polyethylene naphthalate (PEN), or the like.

The pair of pattern electrodes 4 has a pair of comb shaped electrode portions 4a that is patterned so as to have a comb shaped pattern by using stacked metal films of, for example, a Cr film and an Au film, and is arranged opposite to each, other on the thin film thermistor portion 3, and a pair of linear extending portions 4b extending with the tip ends thereof being connected to these comb shaped, electrode portions 4a and the base ends thereof being arranged at the end of the insulating film 2.

A plating portion 4c such as Au plating is formed as a lead wire drawing portion on the base end of each of the pair of linear extending portions 4b. One end of the lead wire is joined with the plating portion 4c via a solder material or the like. Furthermore, except for the end of the insulating film 2 including the plating portions 4c, a polyimide coverlay film 5 is pressure bonded onto the insulating film 2. Instead of the polyimide coverlay film 5, a polyimide or epoxy-based resin material layer may be formed onto the insulating film 2 by printing.

A description will be given below of a method for producing the metal nitride material for a thermistor and a method for producing the film type thermistor sensor 1 using the metal nitride material for a thermistor with reference to FIG. 7.

Firstly, the method for producing the metal nitride material for a thermistor according to the present embodiment includes a deposition step of performing film deposition by reactive sputtering in a nitrogen- and oxygen-containing atmosphere using an M-A-Al alloy sputtering target (where "M" represents at least one of Ti, V, Cr, Mn, Fe, and Co, and "A" (represents at least one of Sc, Zr, Mo, Nb, and W).

For example, a Ti—Sc—Al alloy sputtering target is employed in the case where "M"=Ti, "A"=Sc, a Ti—Zr—Al alloy sputtering target is employed in the case where "M"=Ti, "A"=Zr, a Ti—Mo—Al alloy sputtering target is employed in she case where "M"=Ti, "A"=Mo, a Ti—Nb—Al alloy sputtering target is employed in the case where "M"=Ti, "A"=Nb, and a Ti—W—Al alloy sputtering target is employed in the case where "M"=Ti, "A"=W.

It is preferable that a spattering gas pressure during the reactive sputtering is set to less titan 1.5 Pa.

Furthermore, it is preferable that the formed film is irradiated with nitrogen plasma after the deposition step.

Figure 7:
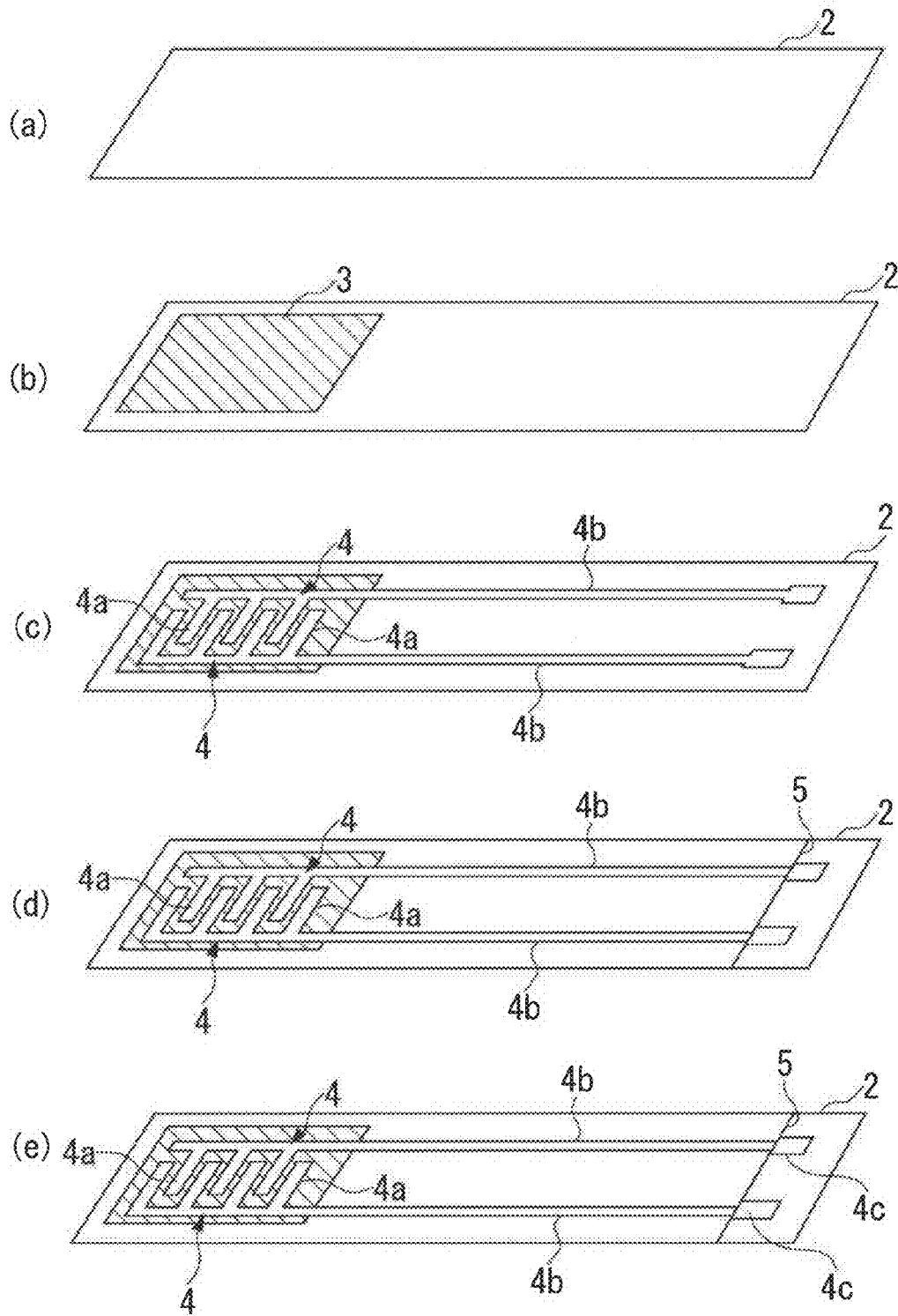
FIG. 7 is a perspective view illustrating a method for producing a film type thermistor sensor in the order of the steps according to the present embodiment.

More specifically, for example, the thin film thermistor portion 3 having a thickness of 200 nm, which is made of the metal nitride material for a thermistor of the present embodiment, is deposited on the insulating film 2 which is a polyimide film having a thickness of 50 μm shown in FIG. 7 (a) by the reactive sputtering method as shown in FIG. 7(b).

For example, the spattering conditions in the case where "M"=Ti, "A"=Sc are as follows: an ultimate degree of vacuum; $5 \times 10^{-6}$ Pa, a sputtering gas pressure; 0.67 Pa, a target input power (output) 300 W, and a nitrogen gas partial pressure and an oxygen gas partial pressure under a mixed gas (Ar gas+nitrogen gas oxygen gas) atmosphere: 39.8% and 0.2%, respectively.

For example, the sputtering conditions in the case where "M"=Ti, "A"=Zr are as follows: an ultimate degree of vacuum: $5 \times 10^6$ Pa, a sputtering gas pressure: 0.4 Pa, a target input power (output); 300 W and a nitrogen gas partial pressure and an oxygen gas partial pressure trader a mixed gas (Ar gas+nitrogen gas+oxygen gas) atmosphere: 19.8% and 0.2%, respectively.

For example, the sputtering conditions in she case where "M"=Ti, "A"=Mo are as follows: an ultimate degree or vacuum: $5/10^{-6}$ Pa, a sputtering gas pressure: 0.4 Pa, a target input power (output): 300 W, and a nitrogen gas partial pressure and an oxygen gas partial pressure under a mixed gas (Ar gas+nitrogen gas+oxygen gas) atmosphere: 39.8% and 0.2%, respectively.

For example, the sputtering conditions in the case where "M"=Ti, "A"=W are as follows: an ultimate degree of vacuum: $5 \times 10^{-6}$ Pa, a sputtering gas pressure: 0.4 Pa, a target input power (output): 300 W, and a nitrogen gas partial pressure and an oxygen gas partial pressure under a mixed gas (Ar gas e nitrogen gas e oxygen gas) atmosphere: 19.8% and 0.2%, respectively.

For example, the sputtering conditions in the case where "M"=Ti, "A"=W are as follows: an ultimate degree of vacuum: $5 \times 10^{-6}$ Pa sputtering gas pressure: 0.4 Pa, a target input power, (output): 300 W and a nitrogen gas partial pressure and an oxygen gas partial pressure under a mixed gas (Ar gas+nitrogen gas+oxygen gas) atmosphere: 19.8% and 0.2%, respectively.

The metal nitride material for a thermistor having a desired size is deposited on the insulating film 2 using a metal mask so as to form the thin film thermistor portion 3. It is preferable that, the formed thin film thermistor portion 3 is irradiated with nitrogen plasma. For example, the thin film thermistor portion 3 is irradiated with nitrogen plasma under the degree of vacuum of 6.7 Pa, the output of 200 W, and the $N_2$ gas atmosphere.

Next, a Cr film having a thickness of 20 nm is formed and an Au film having a thickness of 200 nm is further formed thereon by the sputtering method, furthermore, a resist solution is coated on the stacked metal films using a bar-coater, and then pre-baking is performed for 1.5 minutes at a temperature of 110° C. After being exposed by an exposure device, any unnecessary portion is removed by a developing solution, and then patterning is performed by post-baking for 5 minutes at a temperature of 150° C. Then, any unnecessary electrode portion is subject to wet etching using commercially available Au enchant and Cr etchant, and then the resist is stripped as shown in FIG. 7(c) so as to form a pair of the pattern electrodes 4 each having a desired comb shaped electrode portion 4a. More that the pattern electrodes 4 may be formed in advance on the insulating film 2, and then the thin film thermistor portion may be deposited on the comb shaped electrode portions 4a. In this case, the comb shaped electrode portions 4a of the pattern electrodes 4 are formed below the thin film thermistor portion 3.

Next, as shown in FIG. 7(d), for example, the polyimide coverlay film 5 with an adhesive having a thickness of 50 μm is placed on. the insulating film 2, and then they are bonded to each other under pressurization of 2 MPa at a temperature of 150° C. for 10 minutes using a press machine. Furthermore, as shown in FIG. 7(e), an Au thin film having a thickness of 2 μm is formed at the base ends of the linear extending portions 4b using an Au plating solution so as to form the plating portions 4c.

When a plurality of film type thermistor, sensors 1 is simultaneously produced, a plurality of thin film thermistor portions 3 and a plurality of pattern electrodes 4 are formed on a large-format sheet of the insulating film 2 as described above, and then, the resulting large-format, sheet, is cut into a plurality of segments so as to obtain a plurality of film type thermistor sensors 1.

In this manner, a thin film type thermistor sensor 1 having a size of 25×3.6 mm arid a thickness of 0.1 mm is obtained.

As described above, since the metal nitride material for a thermistor or the present embodiment consists of a metal nitride represented by the general formula: $(M_{1-v}A_v)_xAl_y(N_{1-w}O_w)_z$ (where "M" represents at least one of Ti, V, Cr, Mn, Fe, and Co, "A" represents at least one of Sc, Zr, Mo, Nb, and W, $0.0<v<1.0$, $0.70 \leq y/(x+y) \leq 0.98$, $0.45 \leq z \leq 0.55$, $0<w \leq 0.35$, and $x+y+z=1$), wherein the crystal structure thereof is a hexagonal wurtzite-type (space group: P6$_3$mc (No. 186) single phase, a good B constant and an excellent heat resistance can be obtained without firing. In particular, the heat resistance can be further improved by the effect of oxygen (O) included in a crystal so as to compensate nitrogen defects in the crystal or the like.

Since the metal nitride material for a thermistor is a columnar crystal extending in a vertical direction with respect to the surface of the film, the crystallinity of the film is high, so tear high heat resistance can be obtained.

Furthermore, since the metal nitride material for a thermistor is more strongly oriented along the c-axis than the a-axis in a vertical direction with respect to the surface of the film, a high E constant as compared with the case of a strong a-axis orientation can be obtained.

Since, in the method for producing the metal nitride material for a thermistor of the present embodiment, film deposition is performed by reactive sputtering in a nitrogen- and oxygen-containing atmosphere using an M-A-Al (where "M" represents at least one of Ti, V, Cr, Mn, Fe, and Co, arid "A" represents at least one of Sc, Zr, Mo, Nb, and W) alloy sputtering target, the metal nitride material for a thermistor, which consists of a metal nitride represented by the aforementioned general formula: $(M, A)_xAl_y(N, O)_z$, can be deposited on a film without firing.

Thus, since, in the film type thermistor sensor 1 using the metal nitride material for a thermistor of the present embodiment, the thin film thermistor portion 3 made of the metal nitride material for a thermistor is formed on the insulating film 2, the insulating film 2 having low heat resistance, such as a resin film, can be used because the thin film thermistor portion 3 is formed without firing and has a high B constant are; high heat resistance, so that a thin and flexible thermistor sensor having an excellent thermistor characteristic can be obtained.

A substrate material using a ceramic such as alumina that has often been conventionally used has a problem that if the substrate material is thinned to a thickness of 0.1 mm, for example, the substrate material is very fragile and breaks easily. On the order hand, since a film can be used in the present embodiment, a very thin film, type thermistor sensor having a thickness of 0.1 mm, for example, can be provided.

EXAMPLES

Next, the evaluation results of the materials according to Examples produced based on the above embodiment regarding the metal nitride material for a thermistor, a method for producing the same, and a film type thermistor sensor according to the present invention will be specifically described with reference to FIGS. 8 to 28.

<Production of Film Evaluation Element>

Figure 8:
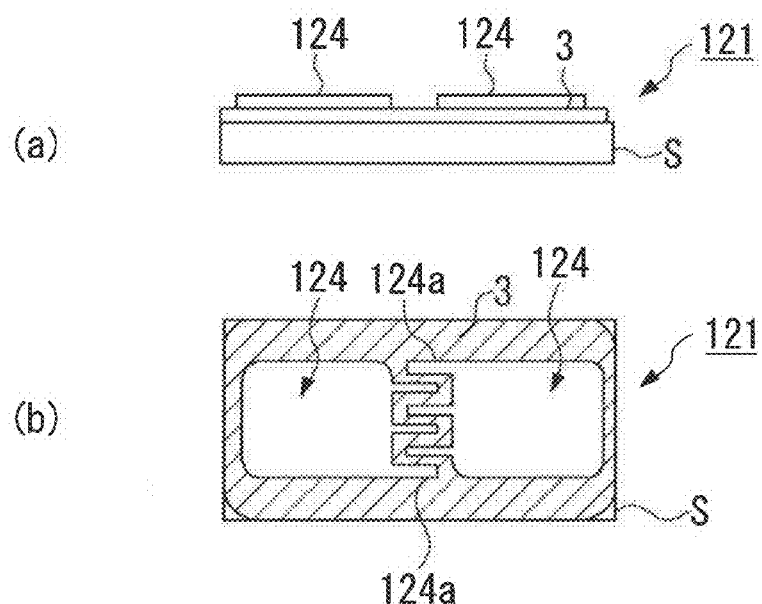
FIG. 8 is a front view and a plan view illustrating a film evaluation element for a metal nitride material for a thermistor according to an Example of a metal nitride material for a thermistor, a method for producing the same, and a film type thermistor sensor of the present invention.
Figure 9:
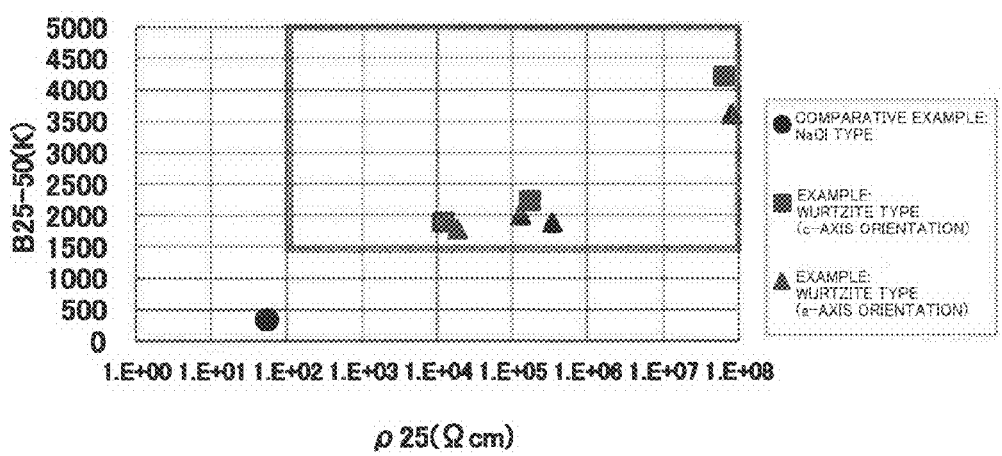
FIG. 9 is a graph illustrating the relationship between a resistivity at 25° C. and a B constant according to Examples and a Comparative Example of the present invention in the case where "M"=Ti, "A"=Sc.
Figure 10:
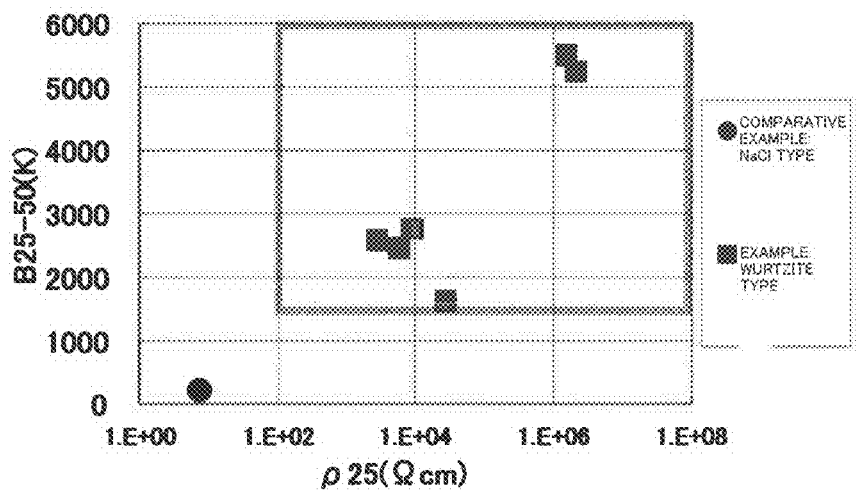
FIG. 10 is a graph illustrating the relationship between a resistivity at 25° C. and a B constant according to Examples and a Comparative Example of the present invention in the case where "M"=Ti, "A"=Zr.
Figure 11:
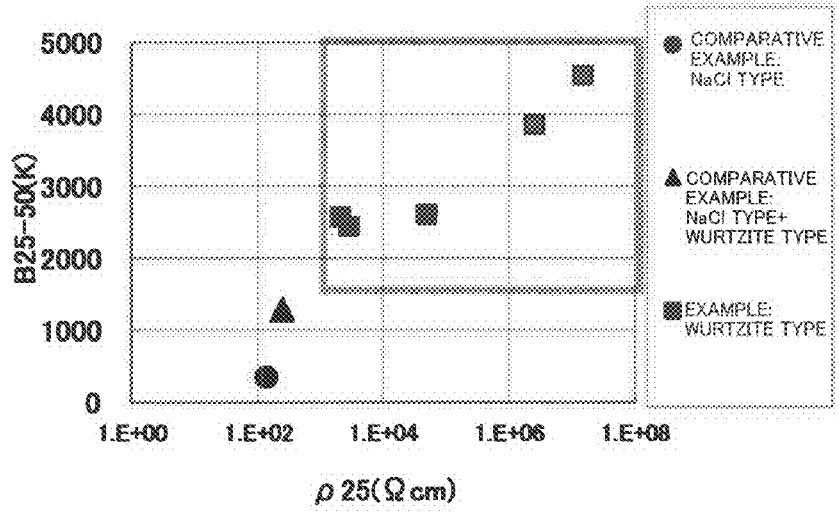
FIG. 11 is a graph illustrating the relationship between a resistivity at 25° C. and a B constant according to Examples and Comparative Examples of the present invention in the case where "M"=Ti, "A"=Mo.
Figure 12:
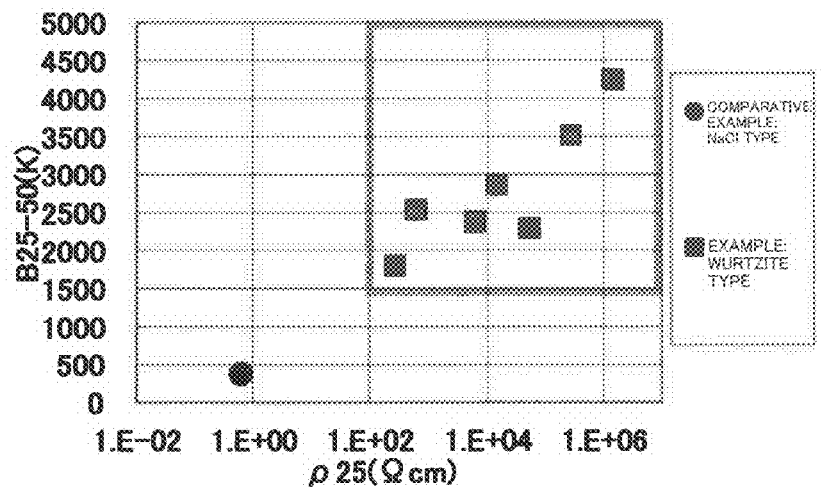
FIG. 12 is a graph illustrating the relationship between, a resistivity at 25° C. and a B constant according to Examples and a Comparative Example of the present invention in the case where "M"=Ti, "A"=Nb.
Figure 13:
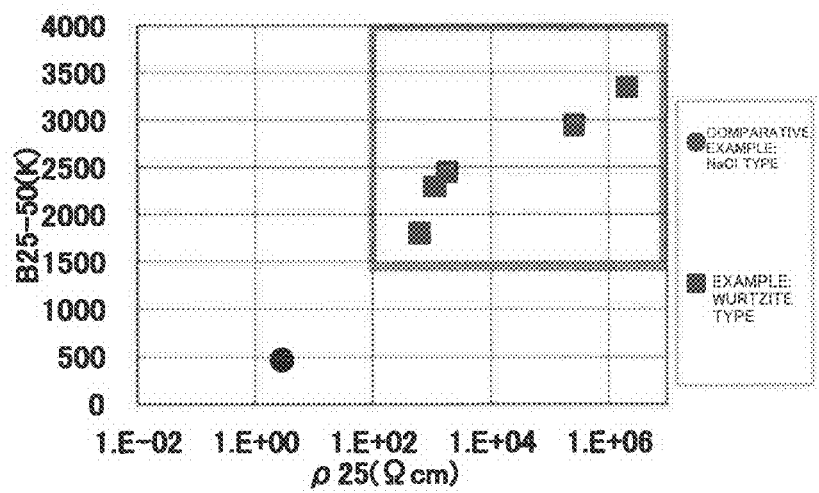
FIG. 13 is a graph illustrating the relationship between a resistivity at 25° C. and a B constant according to Examples and a Comparative Example of the present invention in the case where "M"=Ti, "A"=W.

The film evaluation elements 121 shown in FIG. 8 were produced in Examples and Comparative Examples of the present invention. In each of the following Examples of the present invention, the film evaluation elements 121 were produced using a $(Ti_{1-v}Sc_v)_xAl_y(N_{1-w}O_w)_z$ metal nitride for a thermistor in the case where "M"=Ti, "A"=Sc, a $(Ti_{1-v}Zr_v)_x Al_y(N_{1-w}O_w)_x$ metal nitride for a thermistor in the case where "M"=Ti, "A"=Zr, a $(Ti_{1-v}Mo_v)_xAl_y(N_{1-w}O_z)$ metal nitride for a thermistor in the case where "M"=Ti, "A"=Mo, a $(Ti_{1-v}Nb_v)_xAl_y(N_{1-w}O_w)_z$ metal nitride for a thermistor in the case where "M"=Ti, "A"=Nb, a $(Ti_{1-v}W_v)_xAl_y(N_{1-u}O_u)_z$ metal nitride for a thermistor in the case where "M"=Ti, "A"=W, a $(Cr_{1-v}Zr_v)_xAl_y(N_{1-w}O_w)_z$ metal nitride for a thermistor in the case where "M"=Cr, "A"=Zr, a $(Cr_{1-v}Mo_v)_xAl_y(N_{1-w}O_w)_z$ metal nitride for a thermistor in the case where "M"=Cr, "A"=Mo, a $(Cr_{1-v}Nb_v)_xAl_y(N_{1-w}O_w)_z$ metal nitride for a thermistor in the case where "M"=Cr, "A"=Nb, and a $(Cr_{1-v}W_v)_xAl_y(N_{1-u}O_u)_z$ metal nitride for a thermistor in the case where "M"=Cr, "A"=W.

Firstly, each of the thin film thermistor portions 3 hawing a thickness of 500 nm, which were made of the metal nitride materials for a thermistor with the various composition ratios shown in Tables 2 to 7, was formed on an Si wafer with a thermal oxidation film as an Si substrate S by using a Ti—Sc—Al alloy target, a Ti—Zr—Al alloy target, a Ti—Mo—Al alloy target, a Ti—Nb—Al alloy target, a Ti—d—Al alloy target, a Cr—Zr—Al alloy target, a Cr—Nb—Al alloy target, a Cr—Mo—Al alloy target, or a Cr—W—Al alloy target with various composition ratios by the reactive sputtering method. The thin film thermistor portions 3 were formed under the sputtering conditions of an ultimate degree of vacuum of $5 \times 10^{-6}$ Pa, a sputtering gas pressure of from 0.1 to 1 Pa, a target input power (output) of from 100 to 500 W, and a nitrogen gas partial pressure and an oxygen gas partial pressure under a mixed gas (Ar gas+nitrogen gas+oxygen gas) atmosphere of from 10 to 100% and from 0 to 3%, respectively.

Next, a Cr film having a thickness of 20 nm was formed and an Au film having a thickness of 200 nm was further formed on each of the thin film thermistor portions 3 by the sputtering method. Furthermore, a resist solution was coated on the stacked metal films using a spin coater, and then pre-baking was performed for 1.5 minutes at a temperature of 110° C. After being exposed by an exposure device, any unnecessary portion was removed by a developing solution, and then patterning was performed by post-baking for 5 minutes at a temperature of 150° C. Then, any unnecessary electrode portion was subject to wet etching using commercially available Au etchant and Cr etchant, and then the resist was stripped so as to form a pair of pattern electrodes 124, each having a desired comb shaped electrode portion 124a. Then, the resultant elements were diced into chip elements so as to obtain film evaluation elements 121 used for evaluating a B constant and for testing heat resistance.

Note that the film evaluation elements 121 according to Comparative Examples, each having the composition ratio of $(M, A)_xAl_y(N, O)_z$ (where "M" represents at least one of Ti, V, Cr, Mn, Fe, and Co, and "A" represents at least one of Sc, Zr, Mo, Nb, and W) outside the range of the present invention, and have different crystal systems, were similarly produced for comparative evaluation.

<Film Evaluation>

(1) Composition Analysis

Elemental analysis was performed, on the thin film thermistor portions 3 obtained by the reactive sputtering method by X-ray photoelectron spectroscopy (XPS). In the XPS, a quantitative analysis was performed on a sputtering surface at a depth of 20 nm from the outermost surface by Ar sputtering. The results are sheen in Tables 2 to 7. In the following tables, the composition ratios are expressed by "at %". Some of tine samples were also subject to a quantitative analysis for a sputtering surface at a depth of 100 nm from the outermost surface to confirm that it had the same composition within the quantitative accuracy as one in the sputtering surface at a depth of 20 nm.

In the X-ray photoelectron spectroscopy (XPS), a quantitative analysis was performed under the conditions of an X-ray source of MgKα (350 W), a path energy of 58.0 eV, a measurement interval of 0.125 eV, a photo-electron take-off angle with respect to a sample surface of 45 deg, and an analysis area of about 800 μmϕ. Note that the quantitative accuracy of N/(M+A+Al+N+O) and O/(M+A+Al+N+O) was ±2%, arid that of Al/(M+A+Al) was ±1, respectively (where "M" represents at least one of Ti, V, Cr, Mn, Fe, and Co, and "A" represents at least one of Sc, Zr, Mo, Nb, and W).

(2) Specific Resistance Measurement

The specific resistance, of each of the thin film thermistor portions 3 obtained by the reactive spattering method was measured by the four-probe method at a temperature of 25° C. The results are shown in Tables 2 to 7.

(3) Measurement of B Constant

The resistance values for each of the film evaluation elements 121 at temperatures of 25° C. and 50° C. were measured in a constant, temperature bath, and a B constant was calculated based on the resistance values at temperatures of 25° C. and 50° C. The results are shown in Tables 2 to 7. In addition, it was confirmed that the film evaluation elements 121 were thermistors having a negative temperature characteristic by the resistance values at temperatures of 25° C. and 50° C.

In the B constant calculating method of the present invention, a B constant is calculated by the following formula using the resistance values at temperatures of 25° C. and 50° C.

B constant (K)=ln(R25/R50)/(1/T25−1/T50)

R25 (Ω): resistance value at 25° C.

R50 (Ω): resistance value at 50° C.

T25 (K): 298.15 K, which is an absolute temperature of 25° C. expressed in Kelvin T50 (K): 323.15 K, which is an absolute temperature of 50° C. expressed in Kelvin As can be seen from these results, a thermistor characteristic having a resistivity of 250 Ωcm or higher and a B constant of 1500 K or higher is achieved in all of the Examples in which the composition ratios of $(M, A)_x Al_y (N, O)_z$ (where "M" represents at least, one of Ti, V, Cr, Mn, Fe, and Co, "A" represents at least one of Sc, Zr, Mo, Nb, and W) fall within the region enclosed by the points A, B, C, and D in the ternary phase diagrams shown in FIGS. 1 to 5, i.e., the region where "0.0<v<1.0, 0.70≤y/(x+y)≤0.98, 0.45≤z≤0.55, 0<w≤0.35, and x+y+z=1".

Figure 14:
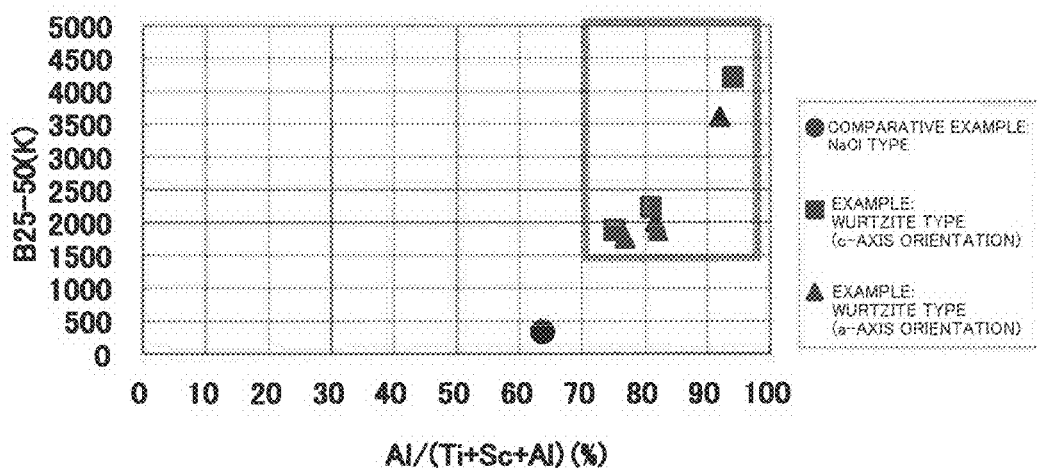
FIG. 14 is a graph illustrating the relationship between the Al/(Ti+Sc+Al) ratio and the B constant, according to Examples and a Comparative Example of the present invention.
Figure 15:
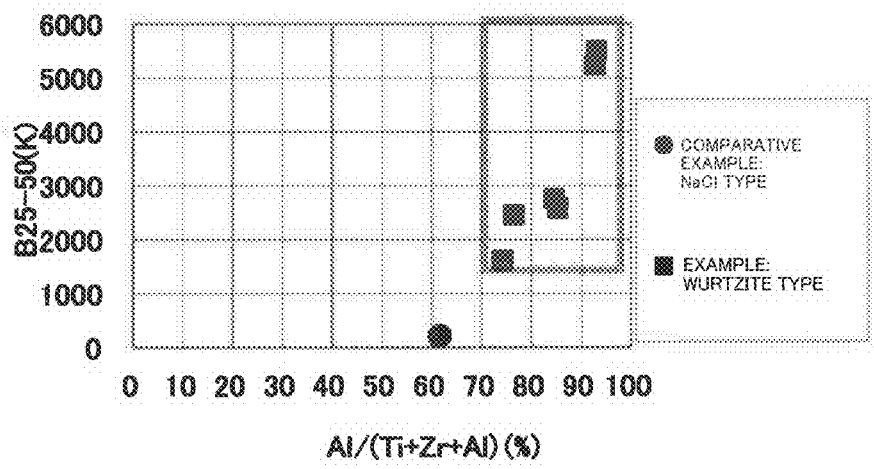
FIG. 15 is a graph illustrating the relationship between the Al/(Ti+Zr+Al) ratio arid the B constant according to Examples and a Comparative Example of the present invention.
Figure 16:
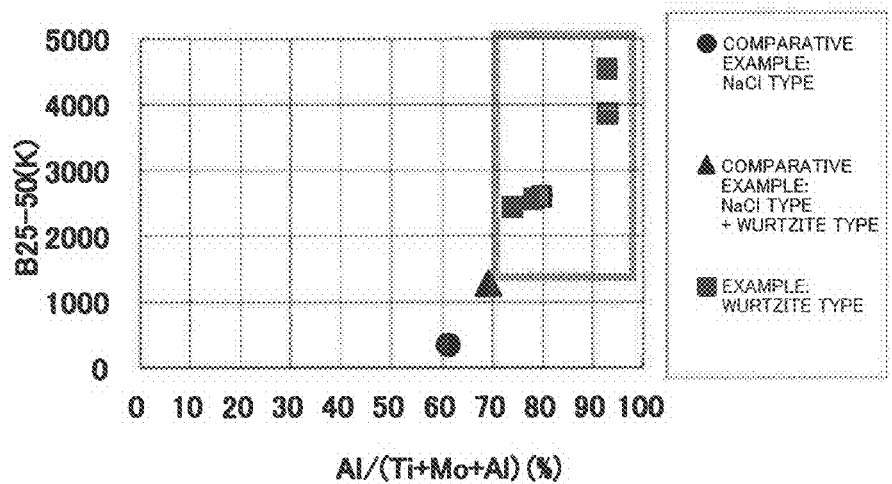
FIG. 16 is a graph illustrating the relationship between the Al/(Ti+Mo+Al) ratio and the B constant, according to Examples and Comparative examples of the present invention.
Figure 17:
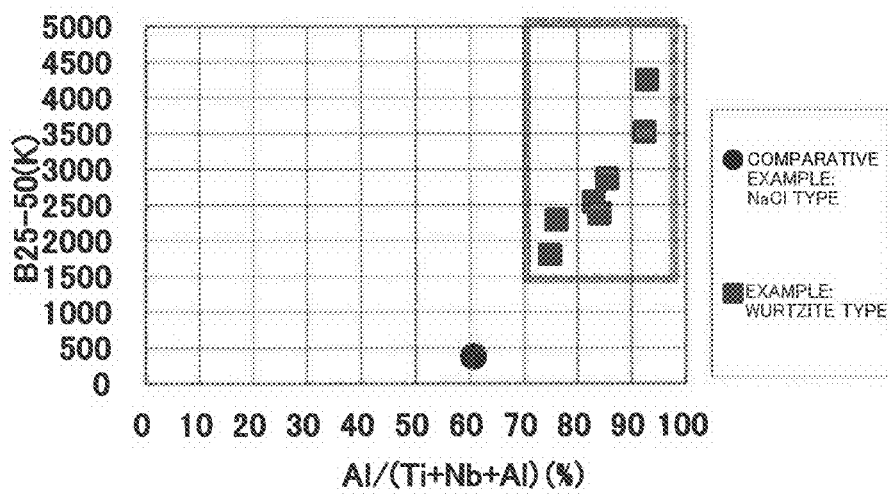
FIG. 17 is a graph illustrating the relationship between the Al/(Ti+Nb+Al) ratio and the B constant according to Examples and a Comparative Example of the present invention.
Figure 18:
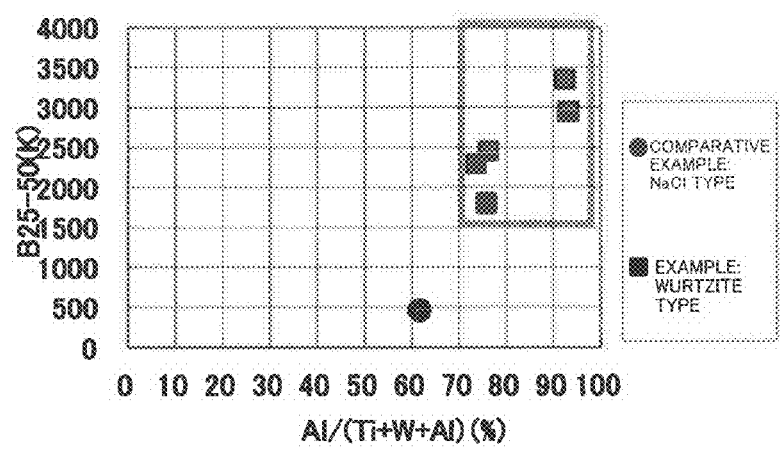
FIG. 18 is a graph illustrating the relationship between the Al/(ti+W+Al) ratio and the B constant according to Examples and a Comparative Example of the present invention.
Figure 19:
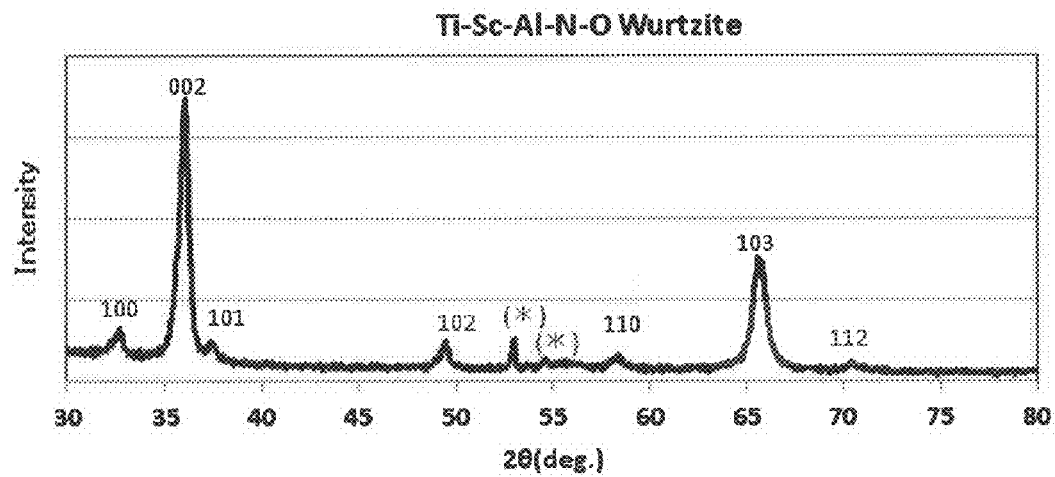
FIG. 19 is a graph illustrating the result of X-ray diffraction (XRD) in the case of a strong c-axis orientation, where Al/(Ti+Sc+Al)=0.81 according to an Example of the present invention.

Graphs illustrating the relationships between a resistivity at 25° C. and a B constant from the above results are shown la FIGS. 9 to 13. A graph illustrating the relationship between the Al/(Ti+Sc+Al) ratio and the B constant is also shown in FIG. 14. A graph illustrating the relationship between the Al/(Ti+Zr+Al) ratio and the B constant is also shown in FIG. 15. A graph illustrating the relationship between the Al/(Ti+Mo+Al) ratio and the B constant is also shown in FIG. 16. A graph illustrating the relationship between the Al/(Ti+Mo+Al) ratio and the B constant is also shown in FIG. 17. Further, a graph illustrating the relationship between the Al/(Ti+W+Al) ratio and the B constant is also shown in FIG. 18.

From these graphs, the film evaluation elements 121, the composition ratios of which fall within the region where Al/(Ti+Sc+Al) is from 0.7 to 0.98 and N+O/(Ti+Sc+Al+N+O) is from 0.45 to 0.55 and each crystal system of which is a hexagonal wurtzite-type single phase, have a specific resistance value at a temperature of 25° C. of 250 Ωcm or higher and a B constant of 1500 K or higher, which are the regions realizing a high resistance and a high B constant.

The film evaluation elements 121, the composition ratios of which fall within the region where Al/(Ti+Zr+Al) is from 0.7 to 0.98 and N+O/(Ti—Zr—Al+N+O) is from 0.45 to 0.55 and each crystal system: of which is a hexagonal wurtzite-type single phase, also have a specific resistance value at a temperature of 25° C. of 250 Ωcm or higher and a B constant of 1500 K or higher, which are the regions realizing a high resistance and a high B constant.

The film evaluation elements 121, the composition ratios of which fall within the region where Al/(Ti+Mo+Al) is from 0.7 to 0.98 and N+O/(Ti+Mo+Al+N+O) is from 0.45 to 0.55 and each crystal system of which is a hexagonal wurtzite-type single phase, also have a specific resistance value at a temperature of 25° C. of 250 Ωcm or higher and a B constant of 1500 K or higher, which are the regions realizing a high resistance and a high B constant.

The film evaluation elements 121, the composition ratios of which fall within the region where Al/(Ti+Nb+Al) is from 0.7 to 0.98 and N+O/(ti+Nb+Al+N+O) is from 0.45 to 0.55 and each; crystal system of which is a hexagonal wurtzite-type single phase, also have a specific resistance value at a temperature of 25° C. of 250 Ωcm or higher and a B constant of 1500 K or higher, which are the regions realizing a high resistance and a high B constant.

Furthermore, the film evaluation elements 121 the composition ratios of which rail within the region where Al/(Ti+W+Al) is from 0.7 to 0.98 and N+O/(Ti+W+Al+N+O) is from 0.45 to 0.55 and each crystal system of which is a hexagonal wurtzite-type single phase also have a specific resistance value at a temperature of 25° C. of 250 Ωcm or higher and a B constant of 1500 K or higher, which are the regions realizing a high resistance and a high B constant.

In data shown in FIGS. 14 to 18, the reason why the B constant varies with respect to nearly the same Al/(Ti+Sc+Al) ratio, Al/(Ti+Zr+Al) ratio, Al/(Ti+Mo+Al) ratio, Al/(Ti+Nb+Al) ratio, or Al/(Ti+W+Al) ratio is because the film evaluation elements 121 have different amounts of nitrogen and/or oxygen in their crystals or different amounts of lattice defects such as nitrogen and/or oxygen defects.

In the material according to Comparative Example 2, where "M"=Ti, "A"=Sc, as shown in Table 2, the composition ratio falls within the region where Al/(Ti+Sc+Al)<0.7, and the crystal system is a cubic NaCl-type phase. Thus, a material with the composition that falls within the region where Al/(Ti+Sc+Al)<0.7 has a specific resistance value at a temperature of 25° C. of less than 250 Ωcm and a B constant of less than 1500 K, which are the regions of low resistance and low B constant.

In the material according to Comparative Example 1 shown in Table 2, the composition ratio falls within the region where N+O/(Ti+Sc+Al+N+O) is less than 40%, that is, the material is in a crystal state where nitridation of metals contained therein is insufficient. Tee material according to Comparative Example 1 was neither a NaCl-type nor wurzite-type phase and had very poor crystallinity. In addition, it was found that the material according to this Comparative Example exhibited near-metallic behavior because both the B constant and the resistance value were very small.

In the material according to Comparative Example 2, where "M"=Ti, "A"=Zr, as shown in Table 3, the composition ratio falls within the region where Al/(Ti+Zr+Al)<0.7, and the crystal system is a cubic NaCl-type phase. Thus, a material with the composition that falls within the region where Al/(Ti+Zr+Al)<0.7 has a specific resistance value at a temperature of 25° C. of less than 250 Ωcm and a B constant of less than 1500 K, which are the regions of low resistance and low B constant.

In the material according to Comparative Example 1 shown in Table 3, the composition ratio fails within the region where N+O/(ti+Zr+Al+N+) is less than 40%, that is, the material is in a crystal state where nitridation of metals contained therein is insufficient. The material according to comparative Example 1 was neither a NaCl-type nor wurtzite-type phase and had very poor crystallinity. In addition, it was found that the material according to this Comparative Example exhibited near-metallic behavior because both the B constant, and the resistance value were very small.

In the material according to Comparative Example 2, where "M"Ti, "A"=Mo, as shown in Table 4. the composition ratio falls within the region where Al/(Ti+Mo+Al<0.66, and the crystal system is a cubic NaCl-type phase. In the material according to Comparative Example 3 shown in Table 4, the composition ratio falls within the region where 0.66<Al/(Ti+Mo+Al)<0.70, and the crystal system is two coexisting phases of a NaCl-type phase and a wurtzite-type phase. Thus, a material with, the composition that falls within the region where Al/(Ti+Mo+Al)<0.7 has a specific resistance value at a temperature of 25° by of less than 250 Ωcm and a B constant of less than 1500 K, which are the regions of low resistance and low B constant. In the material according to Comparative Example 1 shown in Table 4, the composition ratio falls within the region where N+O(Ti+Mo+Al+N+O) is less than 40%, that is, the material is in a crystal state where nitridation of metals contained therein is insufficient. The material according to Comparative Example 1 was neither a NaCl-type nor wurtzite-type phase and had very poor crystallinity. In addition, it was found that the material according to this Comparative Example exhibited near-metallic behavior because both the B constant and the resistance value were very small.

In the material according to Comparative Example 2, where "M"=Ti, "A"=Nb, as shown in Table 5, the composition ratio falls within the region where Al/(Ti+Nb+Al)<0.7, and the crystal system is a cubic NaCl-type phase. Thus, a material with, the composition that falls within the region where Al/(Ti+Nb+Al)<0.7 has a specific resistance value at a temperature of 25° C. of less than 250 Ωcm and a B constant of less than 1500 K, which are the regions of low resistance and low B constant.

In the material according to Comparative Example 1 shown in Table 5, the composition ratio falls within the region, where N+O/(Ti+Nb+Al+N+O) is less than 40%, that is, the material is in a crystal state where nitridation of metals contained therein is insufficient. The material according to Comparative Example 1 was neither a NaCl-type nor wurtzite-type phase and had very poor crystallinity. In addition, it was found that the material according to this Comparative Example exhibited near-metallic behavior because both the B constant and the resistance value were very small.

In the material according to Comparative Example 2, where "M"=Ti, "A"=W, as shown in Table 6, the composition ratio falls within the region where Al/(Ti+W+Al)<0.7, and the crystal system is a cubic NaCl-type phase. Thus, a material with the composition that falls within the region where Al/(Ti+W+Al)<0.7 has a specific resistance value at a temperature of 25° C. of less than 250 Ωcm and a B constant of less than 1500 K, which are the regions of low resistance and low B constant.

In the material according to Comparative Example 1 shown in Table 6, the composition ratio falls within the region where N+O/(Ti+W+Al+N+O) is less than 40%, and thus, the material is in a crystal state where nitridation of metals contained therein is insufficient. The material according to Comparative Example 1 was neither a NaCl-type nor wurtzite-type phase and had very poor crystallinity. In addition, it was found that the material according to this Comparative Example exhibited near-metallic behavior because both the B constant and the resistance value were very small.

Note that, even in the materials according to the Examples shown in Table 7, where "M" is Cr and "T" is Zr, Nb, Mo, or W, when Al/(Cr A+Al) is from 0.7 to 0.98 and N+O/(Cr+A+Al+N+O) is from 0.45 to 0.55, a wurtzite-type hexagonal crystal having thermistor characteristic of high resistance and high B constant can be obtained.

4) Thin Film X-Ray Diffraction (Identification of Crystal Phase)

The crystal phases of the thin film thermistor portions 3 obtained by the reactive sputtering method were identified by Grazing incidence X-ray Diffraction. The thin film X-ray diffraction is a small angle X-ray diffraction experiment. The measurement was performed under the conditions of a vessel of Cu, the angle of incidence of 1 degree, and 2θ of from 20 to 130 degrees. Some of the samples were measured under the condition of the angle of incidence of 0 degree and 2θ of from 20 to 100 degrees.

As a result, of the measurement, a wurtzite-type phase (hexagonal, the same phase as that of Al—N) was obtained in the region where Al/(M+A+Al)≥0.7 (where "M" represents at least one of Ti, V, Cr, Mn, Fe, and Co, and "A" represents at least one of Sc, Zr, Mo, Nb, and W), whereas a NaCl-type phase (cubic, the same phase as that of TiN, ScN, ZrN, MoN, and NbN) was obtained in the region where Al/(M+A+Al)<0.66. It is also contemplated that a crystal phase in which a wurtzite-type phase and a NaCl-type phase coexist will be obtained in the region where 0.66<Al/(M+A+Al)<0.7.

Thus, in the $(M, A)_x Al_y (N, O)_z$-based material (where "M" represents at least one of Ti, V, Cr, Mn, Fe, and Co, and "A" represents at least one of Sc, Zr, Mo, Nb, and W), the regions of high resistance and high B constant can be realized by the wurtzite-type phase having a ratio of Al/(M+A+Al)>0.7. In the Examples of the present invention; no impurity phase was confirmed and the crystal structure thereof was a wurtzite-type single phase.

In Comparative Example 1 shown in Tables 2 to 6, the crystal phase thereof was neither a wurtzite-type nor NaCl-type phase as described above, and thus, could not be identified in the testing. In this Comparative Example, the peak width of XRD was very large, showing that the material had very poor crystallinity. It is contemplated that the crystal phase thereof was metal phase with insufficient nitridation and insufficient oxidation because it exhibited near-metallic behavior from the viewpoint of electric characteristics.

TABLE 2

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | COMPOSITION RATIO | | | | | | | | | RESULT OF ELECTRIC PROPERTIES | |
|---|---|---|---|---|---|---|---|---|---|---|---|---|---|---|---|
| | | | | | Ti/(Ti + Sc + Al + N + O) (%) | Sc/(Ti + Sc + Al + N + O) (%) | Al/(Ti + Sc + Al + N + O) (%) | N/(Ti + Sc + Al + N + O) (%) | O/(Ti + Sc + Al + N + O) (%) | Al/(Ti + Sc + Al) (%) | Sc/(Ti + Sc) (%) | (N + O)/(Ti + Sc + Al + N + O) (%) | N/(Ti + Sc + Al + N) (%) | O/(N + O) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 14.4 | 0.2 | 51 | 30 | 5 | 78 | 1.3 | 35 | 31 | 14 | 61 | 5.E+00 |
| COMPARATIVE EXAMPLE 2 | NaCl TYPE | — | — | — | 17.9 | 0.2 | 32 | 44 | 6 | 64 | 1.1 | 50 | 47 | 13 | 345 | 5.E+01 |
| EXAMPLE 1 | WURTZITE TYPE | 0.05 | c-AXIS | <1.5 | 12.2 | 0.2 | 37 | 47 | 4 | 75 | 1.4 | 51 | 48 | 8 | 1887 | 1.E+04 |
| EXAMPLE 2 | WURTZITE TYPE | 0.09 | c-AXIS | <1.5 | 9.0 | 0.1 | 38 | 47 | 6 | 81 | 0.9 | 53 | 50 | 11 | 2238 | 2.E+05 |
| EXAMPLE 3 | WURTZITE TYPE | 0.83 | c-AXIS | <1.5 | 2.9 | 0.1 | 46 | 44 | 7 | 94 | 2.3 | 51 | 48 | 13 | 4220 | 6.E+07 |
| EXAMPLE 4 | WURTZITE TYPE | 1.10 | a-AXIS | <1.5 | 4.0 | 0.3 | 48 | 40 | 8 | 92 | 6.3 | 48 | 43 | 17 | 3620 | 8.E+07 |
| EXAMPLE 5 | WURTZITE TYPE | 1.32 | a-AXIS | <1.5 | 10.7 | 0.3 | 36 | 35 | 18 | 77 | 2.5 | 53 | 42 | 35 | 1782 | 2.E+04 |
| EXAMPLE 6 | WURTZITE TYPE | 1.36 | a-AXIS | <1.5 | 9.1 | 0.2 | 42 | 45 | 4 | 82 | 2.3 | 49 | 47 | 9 | 2015 | 1.E+05 |
| EXAMPLE 7 | WURTZITE TYPE | 2.36 | a-AXIS | <1.5 | 8.3 | 0.8 | 42 | 43 | 6 | 82 | 8.9 | 49 | 46 | 13 | 1893 | 3.E+05 |

TABLE 3

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | COMPOSITION RATIO | | | | | | | | | RESULT OF ELECTRIC PROPERTIES | |
|---|---|---|---|---|---|---|---|---|---|---|---|---|---|---|---|
| | | | | | Ti/(Ti + Zr + Al + N + O) (%) | Zr/(Ti + Zr + Al + N + O) (%) | Al/(Ti + Zr + Al + N + O) (%) | N/(Ti + Zr + Al + N + O) (%) | O/(Ti + Zr + Al + N + O) (%) | Al/(Ti + Zr + Al) (%) | Zr/(Ti + Zr) (%) | (N + O)/(Ti + Zr + Al + N + O) (%) | N/(Ti + Zr + Al + N) (%) | O/(N + O) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 14 | 4 | 49 | 24 | 9 | 74 | 21 | 33 | 26 | 28 | 188 | 8.E−02 |
| COMPARATIVE EXAMPLE 2 | NaCl TYPE | — | — | — | 18 | 2 | 31 | 43 | 6 | 61 | 10 | 49 | 46 | 13 | 224 | 7.E+00 |
| EXAMPLE 1 | WURTZITE TYPE | 0.41 | c-AXIS | <1.5 | 9 | 2 | 36 | 43 | 10 | 76 | 17 | 53 | 48 | 19 | 2462 | 6.E+03 |
| EXAMPLE 2 | WURTZITE TYPE | 0.66 | c-AXIS | <1.5 | 12 | 2 | 38 | 41 | 7 | 74 | 11 | 48 | 44 | 14 | 1625 | 3.E+04 |
| EXAMPLE 3 | WURTZITE TYPE | 0.07 | c-AXIS | <1.5 | 6 | 1 | 42 | 46 | 5 | 85 | 16 | 51 | 48 | 11 | 2588 | 3.E+03 |
| EXAMPLE 4 | WURTZITE TYPE | 0.05 | c-AXIS | <1.5 | 6 | 2 | 41 | 46 | 5 | 84 | 24 | 51 | 48 | 10 | 2771 | 9.E+03 |
| EXAMPLE 5 | WURTZITE TYPE | 0.47 | c-AXIS | <1.5 | 3 | 1 | 48 | 43 | 5 | 93 | 26 | 48 | 46 | 10 | 5502 | 2.E+06 |
| EXAMPLE 6 | WURTZITE TYPE | 2.05 | a-AXIS | <1.5 | 2 | 1 | 44 | 39 | 14 | 93 | 31 | 53 | 45 | 26 | 5245 | 2.E+06 |

TABLE 4

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | COMPOSITION RATIO | | | | | | | | | RESULT OF ELECTRIC PROPERTIES | |
|---|---|---|---|---|---|---|---|---|---|---|---|---|---|---|---|
| | | | | | Ti/(Ti + Mo + Al + N + O) (%) | Mo/(Ti + Mo + Al + N + O) (%) | Al/(Ti + Mo + Al + N + O) (%) | N/(Ti + Mo + Al + N + O) (%) | O/(Ti + Mo + Al + N + O) (%) | Al/(Ti + Mo + Al) (%) | Mo/(Ti + Mo) (%) | (N + O)/(Ti + Mo + Al + N + O) (%) | N/(Ti + Mo + Al + N) (%) | O/(N + O) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 16 | 4 | 57 | 16 | 7 | 74 | 21 | 22 | | | 23 | 2.E+01 |
| COMPARATIVE EXAMPLE 2 | NaCl TYPE | — | — | — | 17 | 2 | 30 | 42 | 9 | 61 | 8 | 51 | | | 250 | 1.E+02 |
| COMPARATIVE EXAMPLE 3 | NaCl TYPE + WURTZITE TYPE | — | — | — | 9 | 8 | 38 | 34 | 11 | 69 | 47 | 45 | | | 1288 | 2.E+02 |
| EXAMPLE 1 | WURTZITE TYPE | 0.72 | c-AXIS | <1.5 | 5 | 6 | 41 | 43 | 5 | 78 | 56 | 48 | 45 | 10 | 2570 | 2.E+03 |
| EXAMPLE 2 | WURTZITE TYPE | 0.10 | c-AXIS | <1.5 | 3 | 0.5 | 49 | 45 | 2 | 93 | 15 | 47 | 46 | 4 | 4550 | 1.E+07 |
| EXAMPLE 3 | WURTZITE TYPE | 0.72 | c-AXIS | <1.5 | 7 | 5 | 43 | 40 | 5 | 80 | 41 | 45 | 42 | 12 | 2608 | 5.E+04 |
| EXAMPLE 4 | WURTZITE TYPE | 1.10 | a-AXIS | <1.5 | 3 | 0.3 | 46 | 36 | 15 | 93 | 9 | 50 | 42 | 29 | 3868 | 2.E+06 |
| EXAMPLE 5 | WURTZITE TYPE | 4.94 | a-AXIS | <1.5 | 8 | 5 | 37 | 37 | 13 | 74 | 41 | 50 | 42 | 26 | 2446 | 3.E+03 |

TABLE 5

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | COMPOSITION RATIO | | | | | | | | RESULT OF ELECTRIC PROPERTIES | |
|---|---|---|---|---|---|---|---|---|---|---|---|---|---|---|
| | | | | | Ti/(Ti + Mo + Al + N + O) (%) | Mo/(Ti + Mo + Al + N + O) (%) | Al/(Ti + Mo + Al + N + O) (%) | N/(Ti + Mo + Al + N + O) (%) | O/(Ti + Mo + Al + N + O) (%) | Al/(Ti + Mo + Al) (%) | Mo/(Ti + Mo) (%) | (N + O)/(Ti + Mo + Al + N + O) (%) | N/(Ti + Mo + Al + N) (%) | O/(N + O) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 17 | 3 | 56 | 22 | 2 | 74 | 15 | 23 | 22 | 8 | 34 | 6.E−02 |
| COMPARATIVE EXAMPLE 2 | NaCl TYPE | — | — | — | 17 | 2 | 30 | 42 | 9 | 61 | 11 | 51 | 46 | 18 | 381 | 6.E−01 |
| EXAMPLE 3 | | | | | | | | | | | | | | | | |
| EXAMPLE 1 | WURTZITE TYPE | 0.03 | c-AXIS | <1.5 | 6 | 2 | 42 | 48 | 2 | 83 | 27 | 50 | 49 | 4 | 2549 | 6.E+02 |
| EXAMPLE 2 | WURTZITE TYPE | 0.02 | c-AXIS | <1.5 | 5 | 2 | 42 | 46 | 5 | 85 | 26 | 50 | 48 | 8 | 2873 | 1.E+04 |
| EXAMPLE 3 | WURTZITE TYPE | 0.10 | c-AXIS | <1.5 | 2 | 1 | 48 | 44 | 5 | 93 | 33 | 48 | 46 | 10 | 4252 | 1.E+06 |
| EXAMPLE 4 | WURTZITE TYPE | 0.30 | c-AXIS | <1.5 | 10 | 1 | 36 | 44 | 9 | 76 | 12 | 52 | 48 | 16 | 2298 | 5.E+04 |
| EXAMPLE 5 | WURTZITE TYPE | 0.87 | c-AXIS | <1.5 | 12 | 2 | 39 | 42 | 5 | 75 | 11 | 47 | 45 | 10 | 1812 | 3.E+02 |
| EXAMPLE 6 | WURTZITE TYPE | 2.78 | a-AXIS | <1.5 | 6 | 2 | 41 | 37 | 14 | 84 | 28 | 51 | 43 | 27 | 2384 | 6.E+03 |
| EXAMPLE 7 | WURTZITE TYPE | 2.56 | a-AXIS | <1.5 | 2 | 2 | 45 | 38 | 13 | 92 | 43 | 51 | 44 | 26 | 3523 | 3.E+05 |

TABLE 6

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | COMPOSITION RATIO | | | | | | | | | RESULT OF ELECTRIC PROPERTIES | | |
|---|---|---|---|---|---|---|---|---|---|---|---|---|---|---|---|---|
| | | | | | Ti/(Ti + W + Al + N + O) (%) | W/(Ti + W + Al + N + O) (%) | Al/(Ti + W + Al + N + O) (%) | N/(Ti + W + Al + N + O) (%) | O/(Ti + W + Al + N + O) (%) | Al/(Ti + W + Al) (%) | W/(Ti + W) (%) | (N + O)/(Ti + W + Al + N + O) (%) | N/(Ti + W + Al + N) (%) | O/(N + O) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | — | — | 4 | 1 | 76 | 14 | 5 | 94 | 10 | 19 | 15 | 25 | 53 | 8.E−01 |
| COMPARATIVE EXAMPLE 3 | NaCl TYPE | — | — | — | 17 | 3 | 32 | 43 | 5 | 61 | 15 | 48 | 45 | 10 | 469 | 3.E+00 |
| EXAMPLE 1 | WURTZITE TYPE | 0.01 | c-AXIS | <1.5 | 6 | 6 | 39 | 46 | 3 | 76 | 53 | 49 | 47 | 6 | 2454 | 2.E+03 |
| EXAMPLE 2 | WURTZITE TYPE | 0.01 | c-AXIS | <1.5 | 6 | 8 | 39 | 43 | 4 | 73 | 55 | 47 | 45 | 8 | 2300 | 1.E+03 |
| EXAMPLE 3 | WURTZITE TYPE | 0.48 | c-AXIS | <1.5 | 3 | 1 | 49 | 44 | 3 | 92 | 14 | 47 | 46 | 6 | 3350 | 2.E+06 |
| EXAMPLE 4 | WURTZITE TYPE | 1.41 | a-AXIS | <1.5 | 3 | 0.4 | 46 | 39 | 12 | 93 | 12 | 50 | 44 | 23 | 2950 | 3.E+05 |
| EXAMPLE 5 | WURTZITE TYPE | 1.35 | a-AXIS | <1.5 | 5 | 7 | 38 | 42 | 8 | 76 | 54 | 50 | 46 | 17 | 1810 | 6.E+02 |

TABLE 7

| | CRYSTAL SYSTEM | XRD PEAK INTENSITY RATIO OF (100)/(002) WHEN CRYSTAL PHASE IS WURTZITE TYPE | CRYSTAL AXIS EXHIBITING STRONG DEGREE OF ORIENTATION IN VERTICAL DIRECTION WITH RESPECT TO SUBSTRATE SURFACE WHEN CRYSTAL PHASE IS WURTZITE TYPE (c-AXIS OR a-AXIS) | SPUTTERING GAS PRESSURE (Pa) | M ELEMENT | A ELEMENT | M/(M+A+Al+N+O) (%) | A/(M+A+Al+N+O) (%) | Al/(M+A+Al+N+O) (%) | N/(M+A+Al+N+O) (%) |
|---|---|---|---|---|---|---|---|---|---|---|
| EXAMPLE 1 | WURTZITE TYPE | 0.04 | c-AXIS | <1.5 | Cr | Zr | 3 | 4 | 42 | 40 |
| EXAMPLE 2 | WURTZITE TYPE | <0.01 | c-AXIS | <1.5 | Cr | Nb | 0.4 | 4 | 46 | 44 |
| EXAMPLE 3 | WURTZITE TYPE | <0.01 | c-AXIS | <1.5 | Cr | Nb | 0.2 | 4 | 46 | 45 |
| EXAMPLE 4 | WURTZITE TYPE | 0.07 | c-AXIS | <1.5 | Cr | Mo | 3 | 5 | 42 | 38 |
| EXAMPLE 5 | WURTZITE TYPE | 0.07 | c-AXIS | <1.5 | Cr | W | 4 | 5 | 42 | 37 |

| | COMPOSITION RATIO | | | | | | | RESULT OF ELECTRIC PROPERTIES | |
|---|---|---|---|---|---|---|---|---|---|
| | O/(M+A+Al+N+O) (%) | Al/(M+A+Al) (%) | A/(M+A) (%) | (N+O)/(M+A+Al+N+O) (%) | N/(M+A+Al+N) (%) | O/(N+O) (%) | B CONSTANT (K) | SPECIFIC RESISTANCE VALUE AT 25° C. (Ω cm) | |
| EXAMPLE 1 | 11 | 86 | 57 | 51 | 45 | 22 | 2211 | 2.E+04 | |
| EXAMPLE 2 | 6 | 92 | 90 | 50 | 47 | 13 | 2479 | 6.E+04 | |
| EXAMPLE 3 | 5 | 92 | 94 | 50 | 48 | 10 | 2588 | 7.E+04 | |
| EXAMPLE 4 | 12 | 82 | 61 | 49 | 43 | 24 | 1802 | 4.E+02 | |
| EXAMPLE 5 | 12 | 82 | 56 | 49 | 42 | 25 | 1646 | 4.E+02 | |

Next, since all the materials according to the Examples of the present invention were wurtzite-type phase films having strong orientation, whether the films have a strong a-axis orientation or c-axis orientation of the crystal axis in a vertical direction (film thickness direction) with respect to the Si substrate S was examined by XRD. At this time, in order to examine the orientation of the crystal axis, the peak intensity ratio of (100)/(002) was measured, where (100) is the hkl index indicating a-axis orientation and (002) is the hkl index indicating c-axis orientation.

Note that it was confirmed that a wurtzite-type single phase was formed in the same manner even when the thin film thermistor portion 3 was deposited on a polyimide film under the same deposition condition. It was also confirmed that the crystal orientation did not change even when the thin film thermistor portion 3 was deposited on a polyimide film under the same deposition condition.

Exemplary XRD profiles of the materials according to the Examples exhibiting strong c-axis orientation are shown in FIGS. 19 to 23. In the Example shown in FIG. 19, Al/(Ti+Sc+Al) was equal to 0.81 (wurtzite-type, hexagonal), and measurement was performed at the angle of incidence of 1 degree. As can be seen from the result in this Example, the intensity (100) was much stronger than that of (002).

Figure 20:
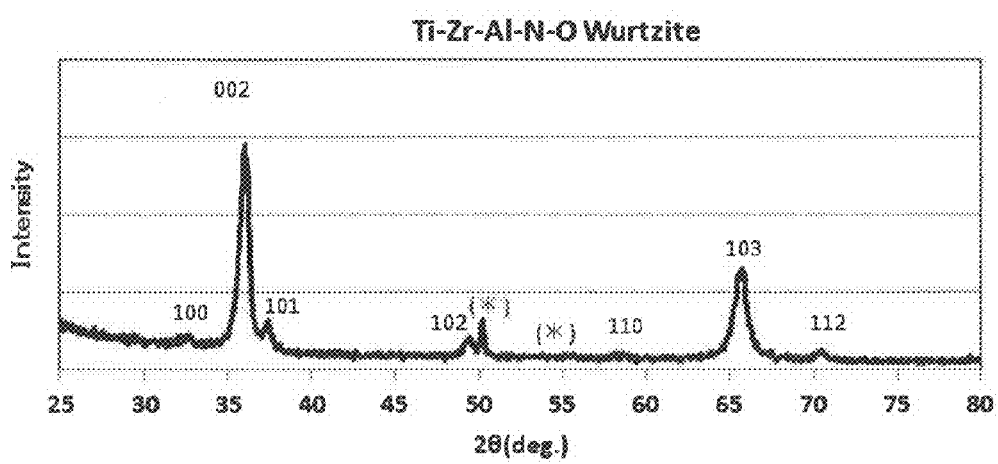
FIG. 20 is a graph illustrating the result of X-ray diffraction (XRD) in the case of a strong c-axis orientation, where Al/(Ti+Zr+Al)=0.84 according to an Example of the present invention.

In the Example shown in FIG. 20, Al/(Ti+Zr+Al) was equal to 0.84 (wurtzite-type, hexagonal, and measurement was performed at the angle of incidence of 1 degree.

Figure 21:
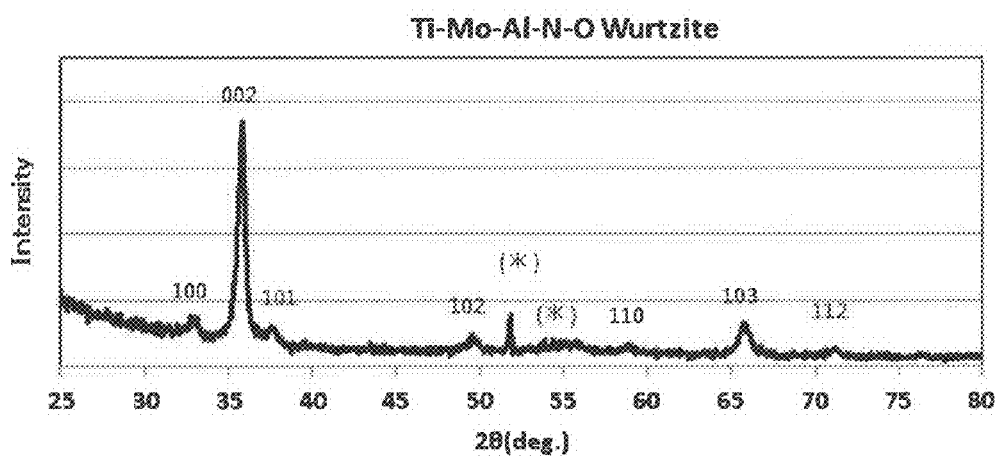
FIG. 21 is a graph illustrating the result of X-ray diffraction (XRD) in the case where a strong c-axis orientation, where Al/(Ti+Mo+Al)=0.93 according to an Example of the present invention.

In the Example shown in FIG. 21, Al/(Ti+Mo+Al) was equal to 0.93 (wurtzite-type, hexagonal), and measurement was performed at the angle of incidence of 1 degree.

Figure 22:
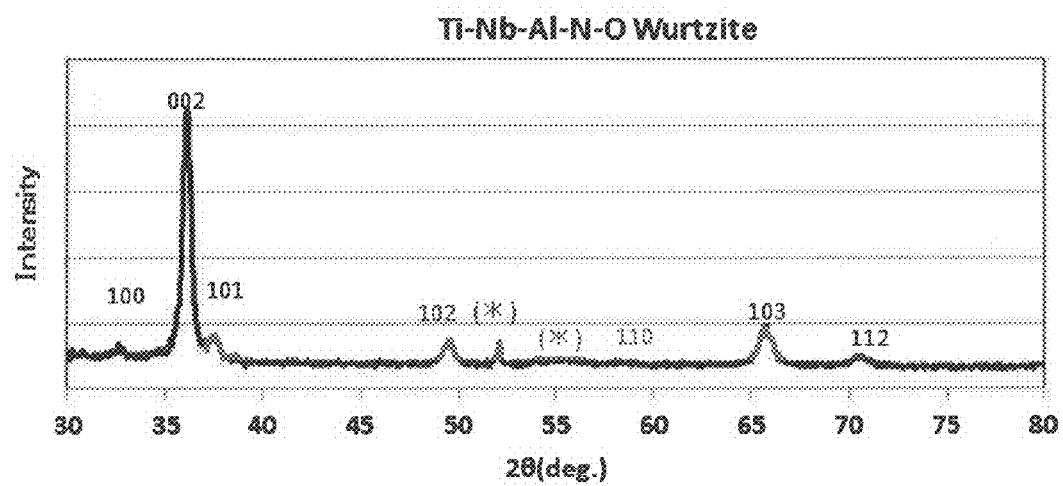
FIG. 22 is a graph illustrating the result of X-ray diffraction (XRD) in the case where a strong c-axis orientation, where Al/(Ti+Nb+Al)=0.83 according to an Example of the present invention.

In the example shown, in FIG. 22, Al/(Ti+Nb+Al) was equal to 0.83 (wurtzite-type, hexagonal), and measurement was performed at the angle of incidence of 1 degree.

Figure 23:
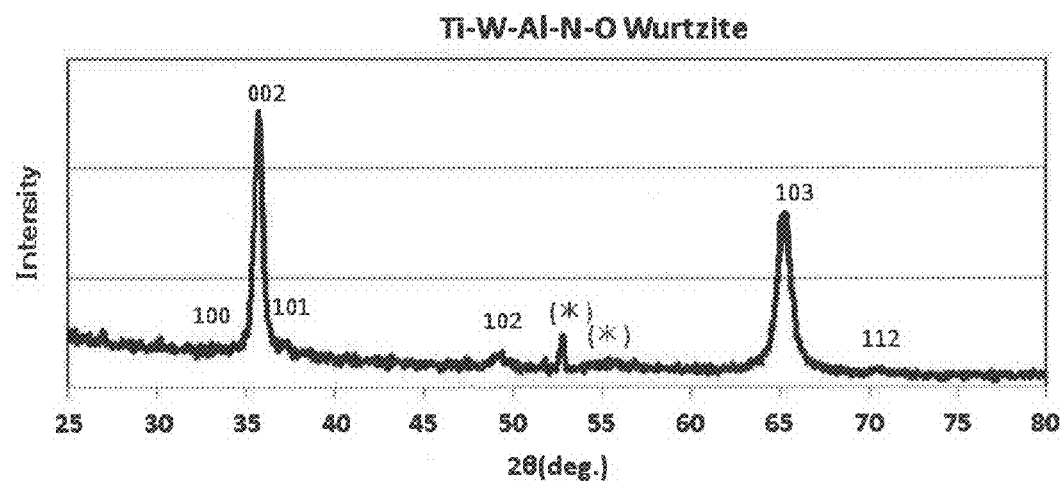
FIG. 23 is a graph illustrating the result of X-ray diffraction (XRD) in the case where a strong c-axis orientation, where Al/(Ti+W+Al)=0.76 according to an Example of the present invention.

In the Example shown in FIG. 23, Al/(Ti+W+Al) was equal to 0.76 (wurtzite-type, hexagonal), and measurement, was performed at the angle of incidence of 1 degree.

As can be seen from she results in these Examples, the intensity of (002) was much stronger than that of (100).

The asterisk (*) in the graphs shows the peak originating from the device or the Si substrate with a thermal oxidation film, and thus, it was confirmed that the peak with the asterisk (*) in the graphs was neither the peak originating from, a sample itself nor the peak originating from an impurity phase. In addition, symmetrical measurement was performed at a 0 degree angle of incidence, confirming that the peak indicated by (*) is lost in the symmetrical measurement, and thus, that it was the peak originating from the device or the Si substrate with a thermal oxidation film.

Next, the correlations between a crystal structure and its electric characteristic were compared with each. other in detail regarding the Examples of the present invention in which the wurtzite-type materials were employed.

As shown in Tables 2 to 6, the crystal axis of some materials is strongly oriented along a c-axis in a vertical direction with respect to the surface of the substrate and that of other materials is strongly oriented along an a-axis in a vertical direction with respect to the surface of the substrate among the materials hawing neatly the same Al/(T+A+Al) ratio, that is, Al/(Ti+Sc+Al) ratio, Al/(Ti+Zr+Al) ratio, Al/(Ti+Mo+Al) ratio, Al/(Ti+Nb+Al) ratio, or Al/(Ti+W+Al) ratio.

When both groups were compared to each other, it was found that the materials having a strong c-axis orientation had a higher B constant than that of the materials having a strong a-axis orientation provided that they have nearly the same Al/(Ti+A+Al) ratio.

In addition, the crystal axis of some materials is strongly oriented along a c-axis in a vertical direction with respect to the surface of the substrate and that of other materials is strongly oriented along an a-axis in a vertical direction with respect to the surface of the substrate among the materials having nearly the same Zr/(Ti+Sc), Zr/(Ti+Zr), Mo/(Ti+Mo), Nb/(Ti+Nb), or W/(Ti+W) ratio. Also in this case, it was found that the materials having a strong c-axis orientation had a higher B constant than that of the materials having a strong a-axis orientation provided that they have nearly the same Zr/(Ti+Sc) ratio, Zr/(Ti+Zr) ratio, Mo/(Ti+Mo) ratio, Nb/(Ti+Nb) ratio, or W/(Ti+W) ratio.

When focus was placed on the amount of N (i.e., N/(Ti+A+Al+N+O), it was found that the materials having a strong c-axis orientation had a slightly larger amount of nitrogen than that of the materials having a strong a-axis orientation. Furthermore, when focus was placed on the amount of O (i.e., O/(N+O)), it was found that the materials hawing a strong a-axis orientation had a slightly larger amount of oxygen than, that of the materials having a strong c-axis orientation.

<Crystal Form Evaluation>

Figure 24:
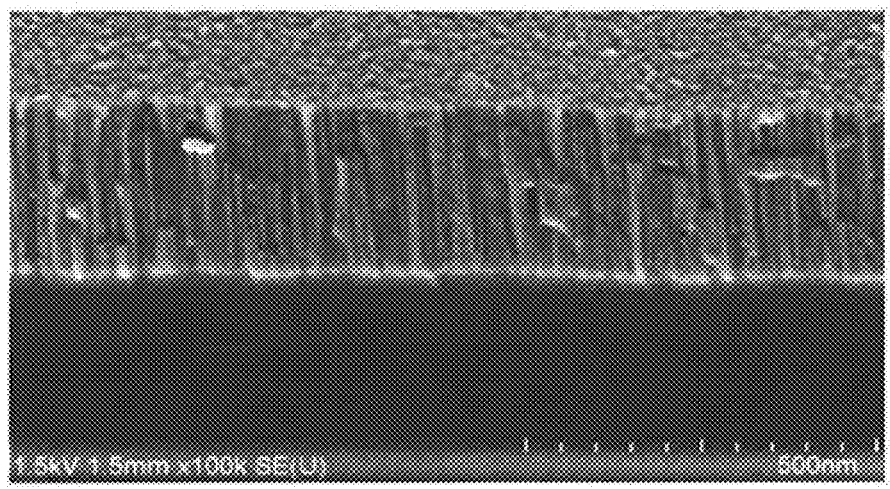
FIG. 24 is a cross-sectional SEM photograph illustrating the material exhibiting a strong c-axis orientation according to Example of the present invention in the case where "M"=Ti, "A"=Sc.

Next, as an exemplary crystal form in the cross-section of the than film thermistor portion 3, a cross-sectional SEM photograph of the thin film thermistor portion 3 according to the Example in the case where "M"=Ti, "A"=Sc (where Al/(Ti+Sc+Al)=0.81, wurtzite-type hexagonal, and strong c-axis orientation, in which the thin film thermistor portion 3 having a thickness of about 430 nm was deposited on the Si substrate S with a thermal oxidation film, is shown in FIG. 24.

Figure 25:
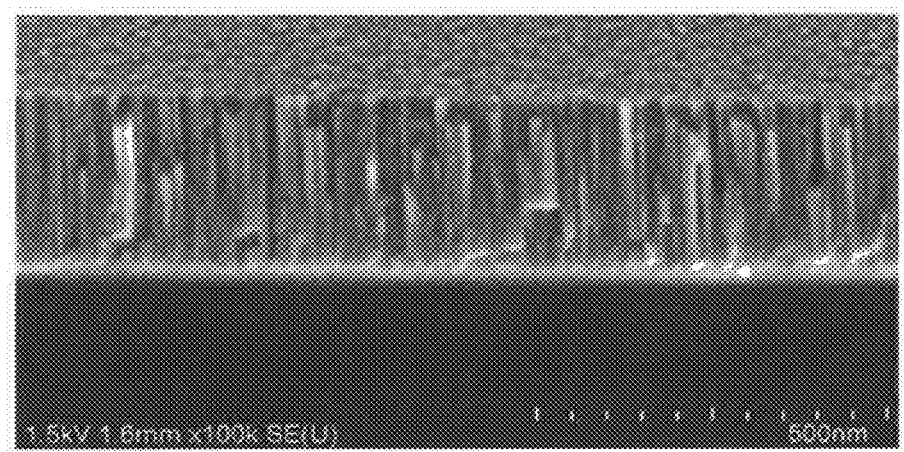
FIG. 25 is a cross-sectional SEM photograph illustrating the material exhibiting a strong c-axis orientation according to Example of the present invention in the case where "M"=Ti, "A"=Zr.

A cross-sectional SEP photograph of the thin film thermistor portion 3 according to the Example in the case where "M"=Ti, "A"=Zr (where Al/(Ti+Zr+Al)=0.84, wurtzite-type hexagonal, and strong c-axis orientation) in which the thin film thermistor portion 3 having a thickness of about 350 nm was deposited on the Si substrate S with a thermal oxidation film, is also shown in FIG. 25.

Figure 26:
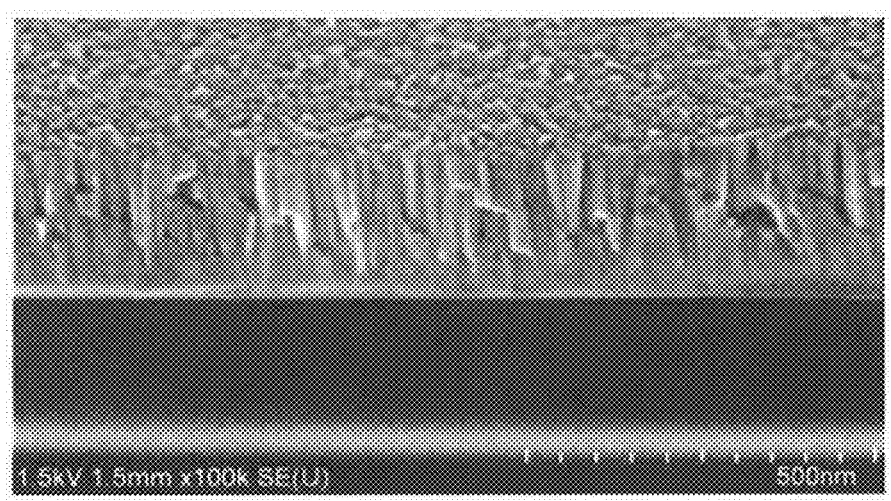
FIG. 26 is a cross-sectional SEM photograph illustrating rhe material exhibiting a strong c-axis orientation according to Example of the present invention in the case where "M"=Ti, "A"=Mo.

A cross-sectional SEM photograph of the thin film thermistor portion 3 according to the Example in the case where "M"=Ti, "A"=Mo (where Al/(Ti+Mo+)=0.93, wurtzite-type hexagonal, and strong c-axis orientation), in which the thin film thermistor portion 3 having a thickness of about 300 nm was deposited on the Si substrate S with a thermal oxidation film, is also shown in FIG. 26.

Figure 27:
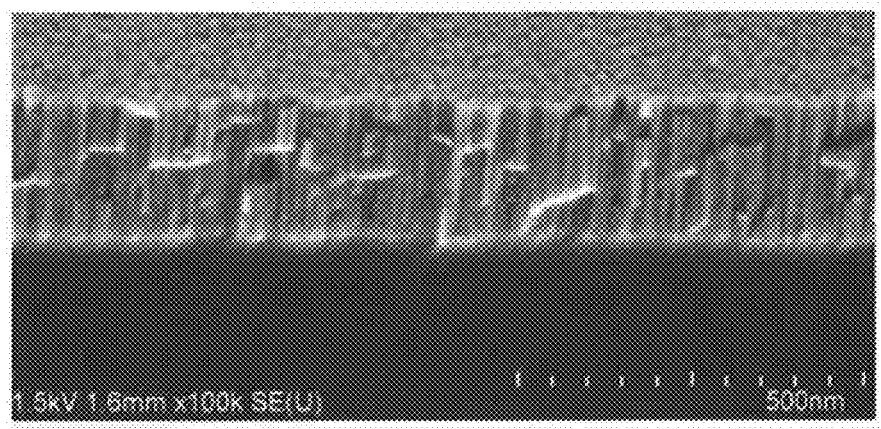
FIG. 27 is a cross-sectional SEM photograph illustrating the material exhibiting a strong c-axis orientation according to Example of the present invention in the case where "M"=Ti, "A"=Nb.

A cross-sectional SEM photograph of the thin film thermistor portion 3 according to the Example in the case where "M"=Ti, "A"=Nb (where Al/(Ti+Nb+Al)=0.83, wurtzite-type hexagonal, and strong c-axis orientation, in which the thin, film thermistor portion 3 having a thickness of about 300 nm was deposited on the Si substrate S with a thermal oxidation film, is also shown in FIG. 27.

Figure 28:
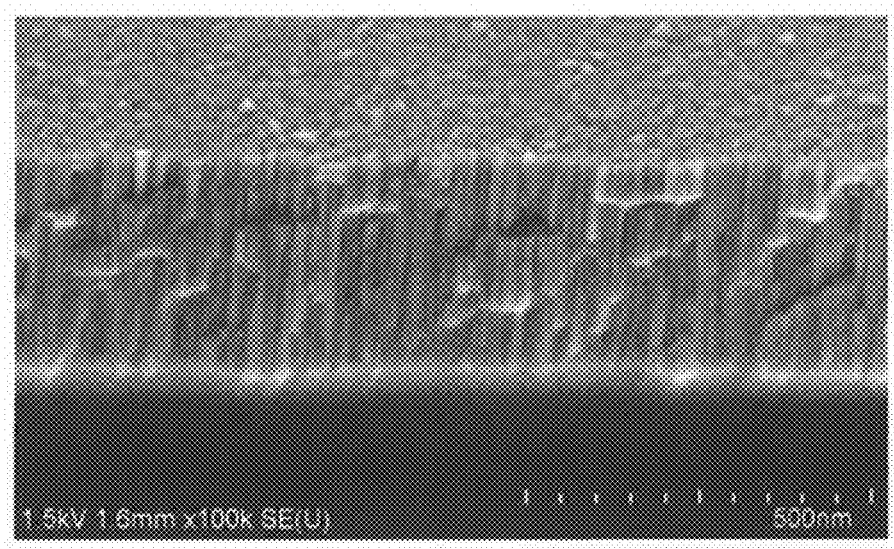
FIG. 28 is a cross-sectional SEM photograph illustrating the material exhibiting a strong c-axis orientation according to Example of the present invention in the case where "M"=Ti, "A"=W.

Furthermore, a cross-sectional SEM photograph of the thin film thermistor portion 3 according to the Example in the case where "M"=Ti, "A"=W (where Al/(Ti+W+Al)= 0.76, wurtzite-type hexagonal, and strong c-axis orientation), in which the thin film thermistor portion 3 having a thickness of about 450 nm was deposited on the Si substrate S with a thermal oxidation film, is also shown in FIG. 28.

The samples in these Examples were obtained by breaking the Si substrates 5 by cleavage. The photographs were taken by tilt observation at an angle of 45 degrees.

As can be seen from these photographs, the samples were formed of a high-density columnar crystal in all Examples. Specifically, the growth of columnar crystals in a vertical direction with respect to the surface of the substrate was observed both in the Examples revealing a strong c-axis orientation and in the Examples revealing a strong a-axis orientation. Note that, the break of the columnar crystal, was generated upon breaking the Si substrate 5 by cleavage.

Regarding the site of a columnar crystal in the drawings, in the Example revealing a strong c-axis orientation shown in FIG. 24 in the case where "M"=Ti, "A"=Sc, the grain size was 10 nmφ (±5 nmφ and the length was about 350 nm. ran.

In the Example revealing a strong c-axis orientation shown in FIG. 25 in the case where "M"=Ti, "A"=Zr, the grain size was 10 nmφ (±5 nmφ) and the length was about 350 nm.

In the Example revealing a strong c-axis orientation shown in FIG. 26 in the case where "M"=Ti, "A"=Mo, the grain size was 12 nmφ (±5 nmφ) and the length was about 300 nm.

In the Example revealing a strong c-axis orientation shown in FIG. 27 in the case where "M"=Ti, "A"=Nb, the grain size was 10 nmφ (±5 nmφ) and the length was about 300 nm.

In the Example revealing a strong c-axis orientation shown in FIG. 28 in the case where "M"=Ti, "A"=W, the grain size was 12 nmφ (±5 nmφ) and the length was about 450 nm.

Note that the grain size here is the diameter of a columnar crystal along the surface of a substrate and the length is that of a columnar crystal in a vertical direction with respect to the surface of the substrate (film thickness).

When the suspect ratio of a columnar crystal is defined as "length/grain size", the materials according to the present Examples have an aspect ratio of 10 or higher. It is contemplated that a film has a nigh-density due to the small grain size of a columnar crystal. It was also confirmed that when a film having a thickness of 200 nm. 500 nm, or 1000 nm was deposited on a Si substrate S with a thermal oxidation film, a columnar crystal having a high-density density was formed as described above.

<Heat Resistance Test Evaluation≤

In some of the materials according to the Examples and the Comparative Examples shown in Tables 2 to 7, a resistance value and a B constant before and after the heat resist since test at a temperature of 125° C. for 1000 hours in air were evaluated. The results are shown in Tables 8 to 12. The material according to Comparative Example made of a conventional Ta—Al—N-based material was also evaluated in the same manner for comparison. In addition, a neat resistance test was performed on the thin film thermistor portion 3 made of the (M+A)-Al—N-based material ("M" represents at least one of Ti, V, Cr, Mn, Fe and Co, and "A" represents at least one of Sc, Zr, Mo, Nb, and W according to Reference Example 1 (hexagonal wurtzite-type, strong c axis orientation) by reactive sputtering under a mixed gas (Ar gas+nitrogen gas; atmosphere containing no oxygen in the same manner for reference. The results are also shown in Tables 8 to 12.

As can be seen from these results, although the Al concentration and the nitrogen concentration vary, both the rising rate of a resistance value and the rising rate of a B constant of the $(M, A)_x Al_y (N, O)_z$-based material (where "M" represents at least one of Ti, V, Cr, Mn, Fe, and Co, and "A" represents at least one of Sc, Zr, Mo, Nb, and W) are smaller than those of the Ta—Al—N-based material according to the Comparative Example, and the heat resistance of the $(M, A)_z Al_y (N, O)_z$-based material ("M" represents at least one of Ti, V, Cr, Mn, Fe, and Co, and "A" represents at least one of Sc, Zr, Mo, Nb, and W) based on the electric characteristic change before and after the heat resistance test is more excellent than that of the Ta—Al—N-based material according to the Comparative Example when the comparison is made by using the materials according to the Examples basing a level of B constant similar to that of the Comparative Example.

In addition, it is found that although the heat resistance of the (M+A.)-Al—based material according to Reference Example 1, which does not positively contain oxygen, is more excellent than that of the Comparative Example, the (M+A)-Al—(N+O)-based material according to Example of the present invention, which positively contain oxygen, has lower rising rate of resistance valve and more excellent heat resistance compared with Reference Example 1.

Note that, in the Ta—Al —N-based material, the ionic radius of Ta is very large compared to that of Ti, Zr, Mo, Nb, and Al, and thus, a wurtzite-type phase cannot be produced in the high-concentration Al region. It is contemplated that the (M+A)-Al—N or (M+A)-Al—(N+O)-based material having a wurtzite-type phase has better heat resistance than the Ta—Al—N-based material because the Ta—Al—N-based material is not a wurtzite-type phase.

TABLE 8

| | M + A ELEMENT | M + A (%) | Al (%) | N (%) | O (%) | Al/(M + Al) (%) | B25-50 (K) | SPECIFIC RESISTANCE VALUE AT 25° C. ($\Omega$ cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | TA | 59 | 2 | 35 | 5 | 3 | 2688 | 6.E+02 | 12 | 6 |
| EXAMPLE 2 | Ti, Sc | 9.1 | 38 | 47 | 6 | 81 | 2238 | 2.E+05 | <1 | <1 |
| EXAMPLE 6 | Ti, Sc | 9.3 | 42 | 45 | 4 | 82 | 2015 | 1.E+05 | <2 | <1 |
| REFERENCE EXAMPLE 1 | Ti, Sc | 9.5 | 43 | 47 | — | 82 | 2231 | 1.E+05 | <4 | <1 |

TABLE 9

| | M + A ELEMENT | M + A (%) | Al (%) | N (%) | O (%) | Al/(M + Al) (%) | B25-50 (K) | SPECIFIC RESISTANCE VALUE AT 25° C. ($\Omega$ cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | Ta | 59 | 2 | 35 | 5 | 3 | 2888 | 6.E+02 | 12 | 6 |
| EXAMPLE 4 | Ti, Zr | 8 | 41 | 46 | 5 | 84 | 2771 | 9.E+03 | <2 | <1 |
| REFERENCE EXAMPLE 1 | Ti, Zr | 8 | 44 | 48 | — | 84 | 2764 | 7.E+03 | <4 | <1 |

TABLE 10

| | M + A ELEMENT | M + A (%) | Al (%) | N (%) | O (%) | Al/(M + Al) (%) | B25-50 (K) | SPECIFIC RESISTANCE VALUE AT 25° C. ($\Omega$ cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | Ta | 59 | 2 | 35 | 5 | 3 | 2688 | 6.E+02 | 12 | 6 |
| EXAMPLE 1 | Ti, Mo | 11 | 41 | 43 | 5 | 78 | 2576 | 2.E+03 | <2 | <1 |
| REFERENCE EXAMPLE 1 | Ti, Mo | 12 | 42 | 46 | — | 78 | 2503 | 2.E+03 | <4 | <1 |

TABLE 11

| | M + A ELEMENT | M + A (%) | Al (%) | N (%) | O (%) | Al/ (M + Al) (%) | B25-50 (K) | SPECIFIC RESISTANCE VALUE AT 25° C. (Ω cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | Ta | 59 | 2 | 35 | 5 | 3 | 2688 | 6.E+02 | 12 | 6 |
| EXAMPLE 1 | Ti, Nb | 8 | 42 | 48 | 2 | 83 | 2549 | 6.E+02 | <2 | <1 |
| REFERENCE EXAMPLE 1 | Ti, Nb | 192 | 42 | 49 | — | 82 | 2447 | 6.E+02 | <4 | <1 |

TABLE 12

| | M + A ELEMENT | M + A (%) | Al (%) | N (%) | O (%) | Al/ (M + Al) (%) | B25-50 (K) | SPECIFIC RESISTANCE VALUE AT 25° C. (Ω cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
|---|---|---|---|---|---|---|---|---|---|---|
| COMPARATIVE EXAMPLE | Ta | 59 | 2 | 35 | 5 | 3 | 2688 | 6.E+02 | 12 | 6 |
| EXAMPLE 1 | Ti, W | 12 | 39 | 46 | 3 | 76 | 2454 | 2.E+03 | <4 | <2 |
| REFERENCE EXAMPLE 1 | Ti, W | 13 | 40 | 47 | — | 76 | 2350 | 1.E+03 | <5 | <2 |

The technical scope of the present invention is not limited to the aforementioned embodiments and Examples, but the present invention may be modified in various ways without departing from the scope or teaching of the present invention.

Although in the above Examples, the metal nitride material for a thermistor which consist of a metal nitride of (M, A) Al (N,O) (where "A" represents at least one of Sc, Zr, Mo, Nb, and W) was produced in the case where "M" is Ti or Cr as an example, at least one of V, Mn, Fe, and Co can be substituted for at least part of Ti or Cr so as to obtain the same characteristic.

REFERENCE NUMERALS

1: film type thermistor sensor, 2: insulating film, 3: thin film thermistor portion, 4 and 124: pattern electrode

What is claimed is:

1. A metal nitride material for a thermistor, consisting of a metal nitride represented by the general formula: $(M_{1-v} A_v)_x Al_y (N_{1-w} O_w)_z$ (where "M" represents at least one of Ti, V, Cr, Mn, Fe, and Co, "A" represents at least one of Sc, Zr, Mo, Nb, and W, $0.0 < v < 1.0$, $0.70 \leq y/(x+y) \leq 0.98$, $0.45 \leq z \leq 0.55$, $0 \leq w \leq 0.35$, and $x+y+z=1$), wherein the crystal structure thereof is a hexagonal wurtzite-type single phase.

2. The metal nitride material for a thermistor according to claim 1, wherein the metal nitride material, is deposited as a film and is a columnar crystal, extending in a vertical direction with respect to the surface of the film.

3. The metal nitride material for a thermistor according to claim 2, wherein the metal nitride material is deposited as a film and is more strongly oriented along a c-axis than an a-axis in a vertical direction with respect to the surface of the film.

4. A film type thermistor sensor comprising:
an insulating film;
a thin film thermistor portion made of the metal nitride material for a thermistor according to claim 2 on the insulating film; and
a pair of pattern electrodes formed at least on the top or the bottom of the thin film thermistor portion.

5. A method for producing the metal nitride material for a thermistor according to claim 2, the method comprising:
a deposition step of performing film deposition by reactive sputtering in a nitrogen- and oxygen-containing atmosphere using an M-A-Al (where "M" represents at least one of Ti, V, Cr, Mn, Fe, and Co, and "A" represents at least one of Sc, Zr, Mo, Nb, and W) alloy sputtering target.

6. The metal nitride material, for a thermistor according to claim 1, wherein the metal nitride material is deposited as a film and is more strongly oriented along a c-axis than, an a-axis in a vertical direction with respect to the surface of the film.

7. A film type thermistor sensor comprising:
an insulating film;
a thin film thermistor portion made of the metal nitride material for a thermistor according to claim 6 on the insulating film; and
a pair of pattern electrodes formed at least on the top or the bottom of the thin film thermistor portion.

8. A film type thermistor sensor comprising:
an insulating film;
a thin film thermistor portion made of the metal nitride material for a thermistor according to claim 1 on the insulating film; and
a pair of pattern electrodes formed at least on the top or the bottom of the thin firm thermistor portion.

9. A method for producing the metal nitride material for a thermistor according to claim 6, the method comprising:
   a deposition step of performing film deposition by reactive sputtering in a nitrogen- and oxygen-containing atmosphere using an M-A-Al (where "M" represents at least one of Ti, V, Cr, Mn, Fe, and Co, and "A" represents at least one of Sc, Zr, Mo, Nb, and alloy sputtering target.

10. A method for producing the metal nitride material for a thermistor according to claim 1, the method comprising:
    a deposition step of performing film deposition by reactive sputtering in a nitrogen- and oxygen-containing atmosphere using an M-A-Al (where "M" represents at least one of Ti, V, Cr, Mn, Fe, and Co, and "A" represents at least one of Sc, Zr, Mo, Nb, and W) alloy sputtering target.

* * * * *